(12) United States Patent
Roberts et al.

(10) Patent No.: US 10,069,072 B2
(45) Date of Patent: Sep. 4, 2018

(54) NANOTUBE SOLUTIONS WITH HIGH CONCENTRATION AND LOW CONTAMINATION AND METHODS FOR PURIFIYING NANOTUBE SOLUTIONS

(75) Inventors: David A. Roberts, Woburn, MA (US); Rahul Sen, Lexington, MA (US); J. Thomas Kocab, Exeter, RI (US); Billy Smith, Woburn, MA (US); Feng Gu, Ellicot City, MD (US)

(73) Assignee: Nantero, Inc., Woburn, MA (US)

( * ) Notice: Subject to any disclaimer, the term of this patent is extended or adjusted under 35 U.S.C. 154(b) by 509 days.

(21) Appl. No.: 13/825,070

(22) PCT Filed: Sep. 20, 2011

(86) PCT No.: PCT/US2011/052350
§ 371 (c)(1),
(2), (4) Date: May 31, 2013

(87) PCT Pub. No.: WO2012/040202
PCT Pub. Date: Mar. 29, 2012

(65) Prior Publication Data
US 2013/0243954 A1    Sep. 19, 2013

Related U.S. Application Data

(60) Provisional application No. 61/384,610, filed on Sep. 20, 2010.

(51) Int. Cl.
*B05D 1/02* (2006.01)
*H01L 51/00* (2006.01)
(Continued)

(52) U.S. Cl.
CPC .......... *H01L 51/0048* (2013.01); *B82Y 40/00* (2013.01); *C02F 1/683* (2013.01);
(Continued)

(58) Field of Classification Search
CPC .......... B05D 1/005; B05D 1/02; B82Y 40/00; B01D 21/262; B01D 37/00; B01D 2251/90; B01D 2251/902
(Continued)

(56) References Cited

U.S. PATENT DOCUMENTS 6,187,823 B1    2/2001  Haddon et al.
6,331,262 B1   12/2001  Haddon et al.
(Continued)

FOREIGN PATENT DOCUMENTS

EP    0947466    6/1999
EP    1061040   12/2000
(Continued)

OTHER PUBLICATIONS

Ago, et al., "Workfunction of Purified and Oxidized Carbon Nanotubes," Synthetic Metals, vol. 103, 1999, pp. 2494-2495.
(Continued)

*Primary Examiner* — Kirsten Jolley
(74) *Attorney, Agent, or Firm* — Nantero, Inc.

(57) ABSTRACT

Solutions of carbon nanotubes and methods for purifying the solutions are provided. The methods include mixing, for example, at least one complexing agents, at least one ionic species, and/or at least one buffer oxide etch (BOE) with a liquid medium containing carbon nanotubes and different types of contaminants, such as metal impurities, amorphous carbon, and/or silica particles, and performing a filtration process to the liquid medium so as to remove or reduce the contaminants in the liquid medium. As a result, carbon nanotube solutions of low contaminants are produced. In some embodiments, the solutions of this disclosure include a high concentration of carbon nanotubes and are substantially free from metal, amorphous carbon, and/or silica impurities.

20 Claims, 11 Drawing Sheets

(51) Int. Cl.

| | | |
|---|---|---|
| *B82Y 40/00* | (2011.01) | |
| *C02F 1/68* | (2006.01) | |
| *B05D 1/00* | (2006.01) | |
| *B01D 37/00* | (2006.01) | |
| *B01D 21/26* | (2006.01) | |
| *C02F 1/36* | (2006.01) | |
| *C02F 1/38* | (2006.01) | |
| *C02F 1/44* | (2006.01) | |
| *C02F 1/52* | (2006.01) | |
| *C02F 101/20* | (2006.01) | |

(52) U.S. Cl.
CPC ............ *B01D 21/262* (2013.01); *B01D 37/00* (2013.01); *B01D 2251/90* (2013.01); *B01D 2251/902* (2013.01); *B05D 1/005* (2013.01); *B05D 1/02* (2013.01); *C02F 1/36* (2013.01); *C02F 1/38* (2013.01); *C02F 1/444* (2013.01); *C02F 1/5236* (2013.01); *C02F 2101/20* (2013.01)

(58) Field of Classification Search
USPC .............................. 427/240, 421.1; 252/502
See application file for complete search history.

(56) References Cited

U.S. PATENT DOCUMENTS

| | | | |
|---|---|---|---|
| 6,368,569 | B1 | 4/2002 | Haddon et al. |
| 6,531,513 | B2 | 3/2003 | Haddon et al. |
| 6,574,130 | B2 | 6/2003 | Segal et al. |
| 6,641,793 | B2 | 11/2003 | Haddon et al. |
| 6,643,165 | B2 | 11/2003 | Segal et al. |
| 6,752,977 | B2 | 6/2004 | Smalley et al. |
| 6,835,591 | B2 | 12/2004 | Rueckes et al. |
| 6,896,864 | B2 | 5/2005 | Clarke |
| 6,921,575 | B2 | 7/2005 | Horiuchi et al. |
| 6,924,538 | B2 | 8/2005 | Jaiprakash et al. |
| 7,115,864 | B2 | 10/2006 | Colbert et al. |
| 7,259,410 | B2 | 8/2007 | Jaiprakash et al. |
| 7,335,395 | B2 | 2/2008 | Ward et al. |
| 7,365,632 | B2 | 4/2008 | Bertin et al. |
| 7,375,369 | B2 | 5/2008 | Sen et al. |
| 2002/0081380 | A1* | 6/2002 | Dillon ................ D01F 9/12 427/249.1 |
| 2003/0065206 | A1 | 4/2003 | Bolskar et al. |
| 2003/0220518 | A1 | 11/2003 | Bolskar et al. |
| 2004/0034177 | A1 | 2/2004 | Chen |
| 2005/0053525 | A1 | 3/2005 | Segal et al. |
| 2005/0058590 | A1 | 3/2005 | Sen et al. |
| 2005/0058797 | A1 | 3/2005 | Sen et al. |
| 2005/0065741 | A1 | 3/2005 | Segal et al. |
| 2005/0269553 | A1 | 12/2005 | Sen et al. |
| 2005/0269554 | A1 | 12/2005 | Sen et al. |
| 2006/0052509 | A1 | 3/2006 | Saitoh |
| 2006/0062718 | A1* | 3/2006 | Bahr et al. .................. 423/461 |
| 2006/0204427 | A1 | 9/2006 | Ghenciu et al. |
| 2008/0012047 | A1 | 1/2008 | Bertin et al. |
| 2008/0286559 | A1* | 11/2008 | Lee .................. C08K 3/04 428/323 |
| 2010/0086470 | A1* | 4/2010 | Mitra et al. ............ 423/447.2 |
| 2010/0143234 | A1* | 6/2010 | Kajiura et al. .......... 423/447.2 |

FOREIGN PATENT DOCUMENTS

| | | |
|---|---|---|
| WO | WO-98/039250 | 9/1998 |
| WO | WO-99/065821 | 12/1999 |
| WO | WO-00/017101 | 3/2000 |
| WO | WO-02/060812 | 8/2002 |
| WO | WO-03/022733 | 3/2003 |
| WO | WO-03/034142 | 4/2003 |
| WO | WO-03/091486 | 11/2003 |
| WO | WO-04/039893 | 5/2004 |
| WO | WO-04/065655 | 8/2004 |
| WO | WO-04/065657 | 8/2004 |
| WO | WO-04/065671 | 8/2004 |
| WO | WO-06/078293 | 7/2006 |

OTHER PUBLICATIONS

Ajayan, et al., "Applications of Carbon Nanotubes," Topics Appl. Phys., vol. 80, 2001, pp. 391-425.

Amblard, G., "Development and characterization of carbon nanotube processes for NRAM technology," Proc. of SPIE, 2011, vol. 7970, pp. 797017-1-797017-7.

Ausman, et al., "Organic Solvent Dispersions of Single-Walled Carbon Nanotubes: Toward Solutions of Pristine Nanotubes," J. Phys. Chem.. B, 2000, vol. 104, No. 38, pp. 8911-8915.

Awano, Y., "Graphene for VLSI: FET and Interconnect Applications," IEDM 2009 Technical Digest, pp. 10.1.1-10.1.4.

Bahr, et al., Dissolution of Small Diameter single-Wall Carbon Nanotubes in Organic Solvents, Chem. Commun., 2001, pp. 193-194.

Banerjee, et al., "Functionalization of Carbon Nanotubes with a Metal-Containing Molecular Complex," Nano Letters, vol. 2, No. 1, 2002, pp. 49-53.

Berhan, et al., "Mechanical Properties of Nanotube Sheets: Alterations in Joint Morphology and Achievable Moduli in Manufacturable Materials," J. Appl. Phys., vol. 95, No. 8, Apr. 2004, pp. 4335-4345.

Brock, et al., "Carbon Nanotube Memories and Fabrics in a Radiation Hard Semiconductor Foundry," 2005 IEEE Conference, 9 pgs.

Brown, K. M., "System in package "The Rebirth of SIP"," 2004 IEEE Custom Integrated Circuits, May 2004, 6 pgs.

Cassell, et al., "Large Scale CVD Synthesis of Single-Walled Carbon Nanotubes," J. Phys. Chem. B, vol. 103, 1999, pp. 6484-6492.

Chen, et al., "Dissolution of Full-Length Single-Walled Carbon Nanotubes," J. Phys. Chem. B, 2001, vol. 105, pp. 2525-2528.

Chen, et al., "Heterogeneous Single-Walled Carbon Nanotube Catalyst Discovery and Optimization," Chem. Mater., vol. 14, 2002, pp. 1891-1896.

Chen, et al., "Noncovalent Sidewall Functionalization of Single-Walled Carbon Nanotubes for Protein Immobilization," J. Am. Chem. Soc., 2001, vol. 123, pp. 3838-3839.

Chen, et al., "Solution Properties of Single-Walled Carbon Nanotubes," Science, 1998, pp. 95-98.

Cheng, H.M., "Large-Scale and Low-Cost Synthesis of Single-Walled Carbon Nanotubes by the Catalytic Pyrolysis of Hydrocarbons," Appl. Phys. Ltrs., vol. 72, No. 25, Jun. 1998, pp. 3282-3284.

Chiang, et al., "Purification and Characterization of Single-Wall Carbon Nanotubes (SWNTs) Obtained from the Gas-Phase Decomposition of Co (HiPco Process)," J. Phys. Chem. B, vol. 105, 2001, pp. 8297-8301.

Chiang, et al., "Purification and Characterization of Single-Wall Carbon Nanotubes," J. Phys. Chem. B, 2001, vol. 105, pp. 1157-1161.

Colomer, et al., "Different Purification Methods of Carbon Nanotubes Produced by Catalytic Synthesis," Synthesis Metals, 1999, vol. 103, pp. 2482-2483.

Crowley, et al., "512 Mb PROM with 8 layers of antifuse/Diode cells," IEEE International Solid-State Circuits Conference, vol. XLVI, Feb. 2003, pp. 284-285.

Delzeit, et al., "Multilayered Metal Catalysts for Controlling the Density of Single-Walled Carbon Nanotube Growth," Chem. Phys. Ltrs., vol. 348, 2001, pp. 368-374.

Desai, et al., "Freestanding Carbon Nanotube Specimen Fabrication," Proceeding 2005 5th IEEE Conference on Nanotechnology, Nagoya, Japan, Jul. 2005, 4 pgs.

Dillon, et al., "A Simple and Complete Purification of Single-Walled Carbon Nanotube Materials," Adv. Mater., 1999, vol. 11, No. 16, pp. 1354-1358.

Georgakilas, et al., "Organic Functionalization of Carbon Nanotubes," J. Am. Chem. Soc., 2002, vol. 124, No. 5, pp. 760-761.

Gromov, "Purification of Carbon Nanotubes," Caramel Workshop, Jan. 23, 2002, 13 pgs.

(56) References Cited

OTHER PUBLICATIONS

Haddon, et al., "Purification and Separation of Carbon Nanotubes," MRS Bulletin, Apr. 2004, pp. 252-259 (www.mrs.org/publications/bulletins).
Hafner, et al., "Catalytic Growth of Single-Wall Carbon Nanotubes from Metal Particles," Chem. Phys. Ltrs., vol. 296, 1998, pp. 195-202.
Hirsch, A., "Functionalization of Single-Walled Carbon Nanotubes," Angew Chem. Int. Ed., 2002, vol. 41, No. 11, pp. 1853-1859.
Hou, et al., "Multi-Step Purification of Carbon Nanotubes," Carbon, 2002, vol. 40, pp. 81-85.
International Search Report, International Patent Application No. PCT/US05/18467 dated Oct. 1, 2007, 5 pgs.
International Search Report, International Patent Application No. PCT/US05/18539 dated Sep. 18, 2006, 4 pgs.
International Search Report, International Patent Application No. PCT/US05/18465 dated Aug. 21, 2006, 3 pgs.
International Search Report, International Patent Application No. PCT/US05/45316 dated Sep. 6, 2006, 2 pgs.
Islam, et al., "High Weight Fraction Surfactant Solubilization of Single-Wall Carbon Nanotubes in Water," Nano Letters, 2003, vol. 3, No. 2, pp. 269-273.
Jeong, et al., "A Purification Method of Single-Wall Carbon Nanotubes Using H2S and O2 Mixture Gas," Chem. Phys. Ltrs., vol. 344, Aug. 2001, pp. 18-22.
Johnson, R. Colin, "IBM Grows Nanotube Patterns on Silicon Wafers," EE Times, Sep. 2002, 1 pg.
Kahn, et al., "Solubilization of Oxidized Single-Walled Carbon Nanotube in Organic and Aqueous Solvents through Organic Derivatization," Nano Letters, vol. 2, No. 11, 2002, pp. 1215-1218.
Kianian, et al., "A 3D Stackable Carbon Nanotube-based Nonvolatile Memory (NRAM)," ESSDERC, Nantero, Inc., Jun. 14, 2010, 4 pgs.
Kong, et al., "Chemical Vapor Deposition of Methane for Single-Walled Carbon Nanotubes," Chem. Phys. Ltrs., vol. 292, Aug. 1998, pp. 567-574.
Kong, et al., "Nanotube Molecular Wires as Chemical Sensors," Science, vol. 287, Jan. 2000, pp. 622-625.
Martinez, et al., "Modifications of Single-Wall Carbon Nanotubes upon Oxidative Purification Treatments," http://www.iop.org/EJ/abstract/0957-4484/14/7/301.printed May 20, 2004.
Matarredona, "Dispersion of Single-Walled Carbon Nanotubes in Aqueous Solutions of the Anionic Surfactant," J. Phys. Chem., 2003, vol. 107, pp. 13357-13367.
Mickelson, et al., "Solvation as Fluorinated Single-Wall Carbon Nanotubes in Alcohol Solvents," J. Phys. Chem. B, 1999, vol. 103, pp. 4318-4322.
Moore, et al., "Individually Suspended Single-Walled Carbon Nanotubes in Various Surfactants," Nano Letters, 2003, pp. 1379-1382.
"Multifunctional Nanotube Composites," http://www.ornl.gov/-odg/compositesmain.html, printed May 20, 2004, 5 pgs.
Murphy, et al., "High-Yield, Nondestructive Purification and Quantification Method for Multiwalled Carbon Nanotubes," J. Phys. Chem. B, 2002, vol. 106, pp. 3087-3091.
Niyogi, et al., "Ultrasonic Dispersions of Single-Walled Carbon Nanotubes," J. Phys. Chem. B, 2003, vol. 107, pp. 8799-8804.
O'Connell, et al., "Reversible Water-Solubilization of Single-Walled Carbon Nanotubes by Polymer Wrapping," Chem. Phys. Lett., 2001, vol. 342, pp. 265-271.
Onoa, et al., "Bulk Production of Singly Dispersed Carbon Nanotubes with Prescribed Lengths," Nanotechnology, vol. 16, 2005, pp. 2799-2803.
Parikh, et al., "Flexible Vapour Sensors Using Single Walled Carbon Nanotubes," Sensors and Actuators B, vol. 113, 2006, pp. 55-63.
Pompeo, et al., "Water Solubilization of Single-Walled Carbon Nanotubes by Functionalization with Glucosamine," Nano Letters, 2002, vol. 2, No. 4, pp. 369-373.
Riggs, et al., "Optical Limiting Properties of Suspended and Solubilized Carbon Nanotubes," J. Phys. Chem. B, 2000, vol. 104, pp. 7071-7076.
Riggs, et al., "Strong Luminescence of Solubilized Carbon Nanotubes," J. Am. Chem. Soc., 2000, vol. 122, pp. 5879-5880.
Rinzler, et al., "Large-Scale Purification of Single-Wall Carbon Nanotubes: Process, Product, and Characterization," Appl. Phys. A, 1998, vol. 67, pp. 29-37.
Rosendale, et al., "A 4 Megabit Carbon Nanotube-based Nonvolatile Memory (NRAM)," ESSCIRC 2010 Proceedings, pp. 478-481.
Rueckes, et al., "Carbon Nanotube-Based Nonvolatile Random Access Memory for Molecular Computing," Science, 2000, vol. 289, pp. 94-97.
Servalli, G., "A 45nm Generation Phase Change Memory Technology," IEDM 2009 Technical Digest, pp. 5.7.1-5.7.4.
Shelimov, et al., "Purification of Single-Wall Carbon Nanotubes by Electronically Assisted Filtration," Chem. Phys. Ltrs., vol. 282, 1998, pp. 429-434.
Snow, et al., "Random Networks of Carbon Nanotubes as an Electronic Material," App. Phys. Ltrs., vol. 82, No. 13, Mar. 2003, pp. 2145-2147.
Sotiropoulou, et al., "Carbon Nanotube Array-Based Biosensor," Anal Bioanal Chem, vol. 375, 2003, pp. 103-105.
Star, et al., "Preparation and Properties of Polymer-Wrapped Single-alled Carbon Nanotubes," Angew. Chem. Int. Ed., 2001, vol. 40, No. 9, pp. 1721-1725.
Sun, et al., "High Dissolution and Strong Light Emission of Carbon Nanotubes in Aromatic Amine Solvents," J. Am. Chem. Soc., 2001, vol. 123, pp. 5348-5349.
Sun, et al, "Soluble Dendron-Functionalized Carbon Nanotubes: Preparation, Characterization, and Properties," Chem. Mater., 2001, vol. 13, pp. 2864-2869.
TIPO's Search Report for Roc Patent Application No. 094118087, 1 pg.
Vivekchand, et al., "A New Method of Preparing Single-Walled Carbon Nanotubes," Proc. Indian Acad. Sci. (Chem. Sci.), 2003, vol. 115, Nos. 5 & 6, pp. 209-518.
Ward, et al., "A Non-Volatile Nanoelectromechanical Memory Element Utilizing a Fabric of Carbon Nanotubes," IEEE 2004, pp. 34-38.
"Wonderous World of Carbon Nanotubes," Multi Disciplinair Project, http://www.students.chem.tue.N1/ifp03/purification.html, 2004, 11 pgs.

* cited by examiner

EDTA (A)

EDTA with Metal (B)

DTPA (C)

Etidronic Acid (D)

NANOTUBE SOLUTIONS WITH HIGH CONCENTRATION AND LOW CONTAMINATION AND METHODS FOR PURIFYING NANOTUBE SOLUTIONS

CROSS-REFERENCE TO RELATED APPLICATIONS

This application is a U.S. national phase application under 35 U.S.C. § 371 of International Patent Application No. PCT/US2011/052350 filed on Sep. 20, 2011, entitled NANOTUBE SOLUTIONS WITH HIGH CONCENTRATION AND LOW CONTAMINATION AND METHODS FOR PURIFYING NANOTUBE SOLUTIONS, which claims priority under 35 U.S.C. § 119(e) to U.S. Provisional Patent Application No. 61/384,610, filed Sep. 20, 2010, which is incorporated by reference its entirety. This application is also related to the following U.S. patents, which are assigned to the assignee of the present application, and are hereby incorporated by reference in their entirety:

Methods of Nanotube Films and Articles (U.S. Pat. No. 6,835,591), filed Apr. 23, 2002;

Methods of Using Pre-Formed Nanotubes to Make Carbon Nanotube Films, Layers, Fabrics, Ribbons, Elements, and Articles (U.S. Pat. No. 7,335,395), filed Jan. 13, 2003;

Devices Having Horizontally-Disposed Nanofabric Articles and Methods of Making the Same (U.S. Pat. No. 7,259,410), filed Feb. 11, 2004;

Devices Having Vertically-Disposed Nanofabric Articles and Methods of Making Same (U.S. Pat. No. 6,924,538), filed Feb. 11, 2004;

Resistive Elements Using Carbon Nanotubes (U.S. Pat. No. 7,365,632), filed Sep. 20, 2005; and Spin-Coatable Liquid for Formation of High Purity Nanotube Films (U.S. Pat. No. 7,375,369), filed Jun. 3, 2004.

This application relates to the following patent applications, which are assigned to the assignee of this application, and are hereby incorporated by reference in their entirety:

Methods of Making Carbon Nanotube Films, Layers, Fabrics, Ribbons, Elements, and Articles (U.S. patent application Ser. No. 10/341,005), filed Jan. 13, 2003;

High Purity Nanotube Fabrics and Films (U.S. patent application Ser. No. 10/860,332), filed Jun. 3, 2004;

Aqueous Carbon Nanotube Applicator Liquids and Methods for Producing Applicator Liquids Thereof (U.S. patent application Ser. No. 11/304,315), filed Dec. 15, 2005; and Anisotropic Nanotube Fabric Layers and Films and Methods of Forming Same (U.S. patent application Ser. No. 12/533,687), filed Jul. 31, 2009.

BACKGROUND

Technical Field

The present disclosure relates to solutions or dispersions of carbon nanotubes (CNT) and methods for producing the solutions or dispersions. More particularly, the present disclosure relates to solutions or dispersions of carbon nanotubes with high concentration and low contaminations, and methods for purifying the CNT solution or dispersions.

Related Art

Carbon nanotubes (CNT) are useful for many applications. At the present time, engineers have been successful in building semiconductor devices from CNTs by taking advantage of the conducting and/or semiconducting properties of the CNTs. For example, individual nanotubes may be used as conducting elements, e.g. as the channel of a transistor. However, the placement of millions of catalyst particles and the growth of millions of properly aligned nanotubes of specific length presents serious challenges. U.S. Pat. Nos. 6,643,165 and 6,574,130 describe electromechanical switches using flexible nanotube-based fabrics (nanofabrics) derived from solution-phase coatings of nanotubes in which the nanotubes first are grown, then brought into solution, and applied to substrates at ambient temperatures. Nanotubes may be derivatized in order to facilitate bringing the tubes into solution. However, in uses where pristine nanotubes are necessary, it is often difficult to remove the derivatizing agent. Even when removal of the derivatizing agent is not difficult, such removal is an added, time-consuming step.

Generally, solvents being used to solubilize and disperse the carbon nanotubes are organic, such as ODCB, chloroform, ethyl lactate, to name just a few. The solutions are stable but the solvents have the disadvantage of not solubilizing clean carbon nanotubes which are free from amorphous carbon. A method has been developed to remove most of the amorphous carbon and solubilize the carbon nanotubes at high concentrations in water via pH manipulation.

There have been few attempts to disperse SWNTs in aqueous and non-aqueous solvents. Chen et al. first reported solubilization of shortened, end-functionalized single-walled nanotubes (SWNTs) in solvents such as chloroform, dichloromethane, orthodichlorobenzene (ODCB), $CS_2$, dimethyl formamide (DMF) and tetrahydrofuran (THF). See, "Solution Properties of Single-Walled Nanotubes," Science 1998, 282, 95-98. Ausman et al. reported the use of SWNTs solutions using sonication. The solvents used were N-methylpyrrolidone (NMP), DMF, hexamethylphosphoramide, cyclopentanone, tetramethylene sulfoxide and ε-caprolactone (listed in decreasing order of carbon nanotube solvation). Ausman at el. generally conclude that solvents with good Lewis basicity (i.e., availability of a free electron pair without hydrogen donors) are good solvents for SWNTs. See, "Organic Solvent Dispersions of Single-Walled Carbon Nanotubes: Toward Solutions of Pristine Nanotubes," J. Phys. Chem. B 2000, 104, 8911. Other early approaches involved the fluorination or sidewall covalent derivatization of SWNTs with aliphatic and aromatic moieties to improve nanotube solubility. See, e.g., E. T. Mickelson et al., "Solvation of Fluorinated Single-Wall Carbon Nanotubes in Alcohol Solvents," J. Phys. Chem. B 1999, 103, 4318-4322.

Full-length soluble SWNTs can be prepared by ionic functionalization of the SWNT ends dissolved in THF and DMF. See, Chen et al., "Dissolution of Full-Length Single-Walled Carbon Nanotubes," J. Phys. Chem. B 2001, 105, 2525-2528 and J. L. Bahr et al Chem. Comm. 2001, 193-194. Chen et al. used HiPCO™ as-prepared (AP)-SWNTs and studied a wide range of solvents. (HiPCO™ is a trademark of Rice University for SWNTs prepared under high pressure carbon monoxide decomposition). The solutions were made using sonication.

Bahr et al. ("Dissolution Of Small Diameter Single-Wall Carbon Nanotubes In Organic Solvents," Chem. Comm., 2001, 193-194) reported the most favorable solvation results using ODCB, followed by chloroform, methylnaphthalene, bromomethylnaphthalene, NMP and DMF as solvents. Subsequent work has shown that good solubility of AP-SWNT in ODCB is due to sonication induced polymerization of ODCB, which then wraps around SWNTs, essentially producing soluble polymer wrapped (PW)-SWNTs. See Niyogi et al., "Ultrasonic Dispersions of Single-Walled Carbon Nanotubes," J. Phys. Chem. B 2003, 107, 8799-8804. Polymer wrapping usually affects sheet resistance of the SWNT network and may not be appropriate for electronic applications where low sheet resistance is desired. See, e.g., A. Star et al., "Preparation and Properties of Polymer-Wrapped Single-Walled Carbon Nanotubes," Angew. Chem. Int. Ed. 2001, 40, 1721-1725 and M. J. O'Connell et al., "Reversible Water-Solubilization Of Single-Walled Carbon Nanotubes By Polymer Wrapping," Chem. Phys. Lett. 2001, 342, 265-271.

While these approaches were successful in solubilizing the SWNTs in a variety of organic solvents to practically relevant levels, all such attempts resulted in the depletion of the electrons that are essential to retain interesting electrical and optical properties of nanotubes. Other earlier attempts involve the use of cationic, anionic, or non-ionic surfactants to disperse the SWNT in aqueous and non-aqueous systems. See, Matarredona et al., "Dispersion of Single-Walled Carbon Nanotubes in Aqueous Solutions of the Anionic Surfactant," J. Phys. Chem. B 2003, 107, 13357-13367. While this type of approach has helped to retain the electrical conductivity and optical properties of the SWNTs, most such methods leave halogens or alkali metals or polymeric residues, which tend to severely hamper any meaningful use in microelectronic fabrication facilities.

There is a need for a method of solvating or dispensing nanotubes in solvents for use in electronics applications. Such a method can allow for removal of amorphous carbon and other contaminants, leaving carbon nanotubes a high concentration of CNTs in solution. Such a solution could be useful for making high-uniformity nanotube fabrics on various substrates including silicon. The use of such a solution would require few applications (i.e. spin coat applications), to produce a fabric of controllable sheet resistance with high uniformity. Such a solution could have many other applications as well. There is a further need for methods that meet the criteria outlined above for low toxicity, purity, cleanliness, ease of handling, and scalability.

SUMMARY

In view of the above, there is a need to develop a process to purify the CNT solution, thereby obtaining a CNT solution with low contaminations. The CNT solution so obtained may be suitable for use in semiconductor facilities that require low contaminations.

In one embodiment, a method for producing or purifying a carbon nanotube solution is provided. The method includes dispersing nanotube materials in a liquid medium, mixing a complexing agent with the liquid medium to react with metal impurities in the liquid medium, and performing a filtration process to the liquid medium so as to reduce the metal impurities in the liquid medium. After mixing the complexing agent, the method may further include sonicating the liquid medium in a chilled sonication bath of about 15° C. (or at any temperature in the range of about 5-25° C.) for about 30 minutes, followed by a cross flow filtration process to remove impurities as permeate. The cross flow filtration process may be repeated several times until the concentration of metal impurities is below a predetermined concentration. Alternatively, both the mixing step and the cross flow filtration process may be repeated for several times until a concentration of the metal impurities is below a predetermined concentration. The method further includes performing a centrifugation process to the liquid medium so as to remove amorphous carbon and larger particles. The complexing agent (or chelating agent) is defined as chemicals that form soluble, complex molecules with certain metal ions, inactivating the ions so that they cannot normally react with other elements or ions to produce precipitates or scale. Examples of such complexing agent can include chemicals such as ethylenediaminetetraacetic acid (EDTA), diethylene triamine pentaacetic acid (DTPA), etidronic acid, or combinations thereof.

In one embodiment, a carbon nanotube solution is provided. The solution includes a liquid medium, and a plurality of carbon nanotubes in the liquid medium, wherein the liquid medium includes a first concentration of divalent or trivalent metal impurities and a second concentration of residual complexing agents. The liquid medium may be distilled or deionized water. The liquid medium may also include a non-aqueous solvent. The first concentration of individual metal impurities in the liquid medium is equal to or less than 25 parts per billion. The individual metal impurities may include iron, calcium, magnesium, copper, nickel, zinc, etc. The solution has a nanotube concentration of about 333 mg/L or more.

In one embodiment, a method for using the nanotube solution is provided. The method includes spreading the nanotube solution on a semiconductor substrate by spin coating the solution on the semiconductor substrate, by spraying the solution on the semiconductor substrate, or by dipping the semiconductor substrate in the solution.

In one embodiment, a method for removing amorphous carbon and/or silica is provided. The method includes mixing ionic species with a liquid medium containing carbon nanotubes and at least one of silica and amorphous carbon, and performing a filtration process to the liquid medium so as to remove the amorphous carbon or the silica contained in the liquid medium. The method may further include performing a centrifugation process to the liquid medium so as to remove the amorphous carbon or the silica contained in the liquid medium. In another embodiment, the method may include mixing the ionic species with the liquid medium and performing the filtration process and the centrifugation process sequentially. Moreover, the method further includes sonicating the liquid medium after mixing the ionic species with the liquid medium.

In one embodiment, a carbon nanotube solution is provided. The solution includes a liquid medium and a plurality of carbon nanotubes in the liquid medium, wherein the liquid medium includes a first concentration of amorphous carbon and a second concentration of residual non-metal ionic species. Alternatively, the liquid medium may include a first concentration of metal impurities, a second concentration of residual complexing agents, a third concentration of amorphous carbon, and a fourth concentration of residual non-metal ionic species. The solution has a nanotube concentration of about 333 mg/L or more.

In one embodiment, a method for purifying a carbon nanotube solution is provided. The method includes mixing a buffer oxide etch (BOE) solution with a liquid medium containing carbon nanotubes and silica particles so as to dissolve the silica particles, and performing a filtration process to the liquid medium so as to remove the dissolved silica particle and to obtain a nanotube filtercake.

In one embodiment, a carbon nanotube solution is provided. The solution includes a liquid medium and a plurality of carbon nanotubes in the liquid medium. The liquid medium includes a first concentration of a buffer oxide etch (BOE) solution and the liquid medium with silica particles substantially reduced. By using the solution with silica particles substantially reduced, a nanotube fabric may be formed to have less than three visual defects on a semiconductor wafer of larger than 100 mm. The solution has a nanotube concentration of about 333 mg/L or more.

DETAILED DESCRIPTIONS

Figure 1:
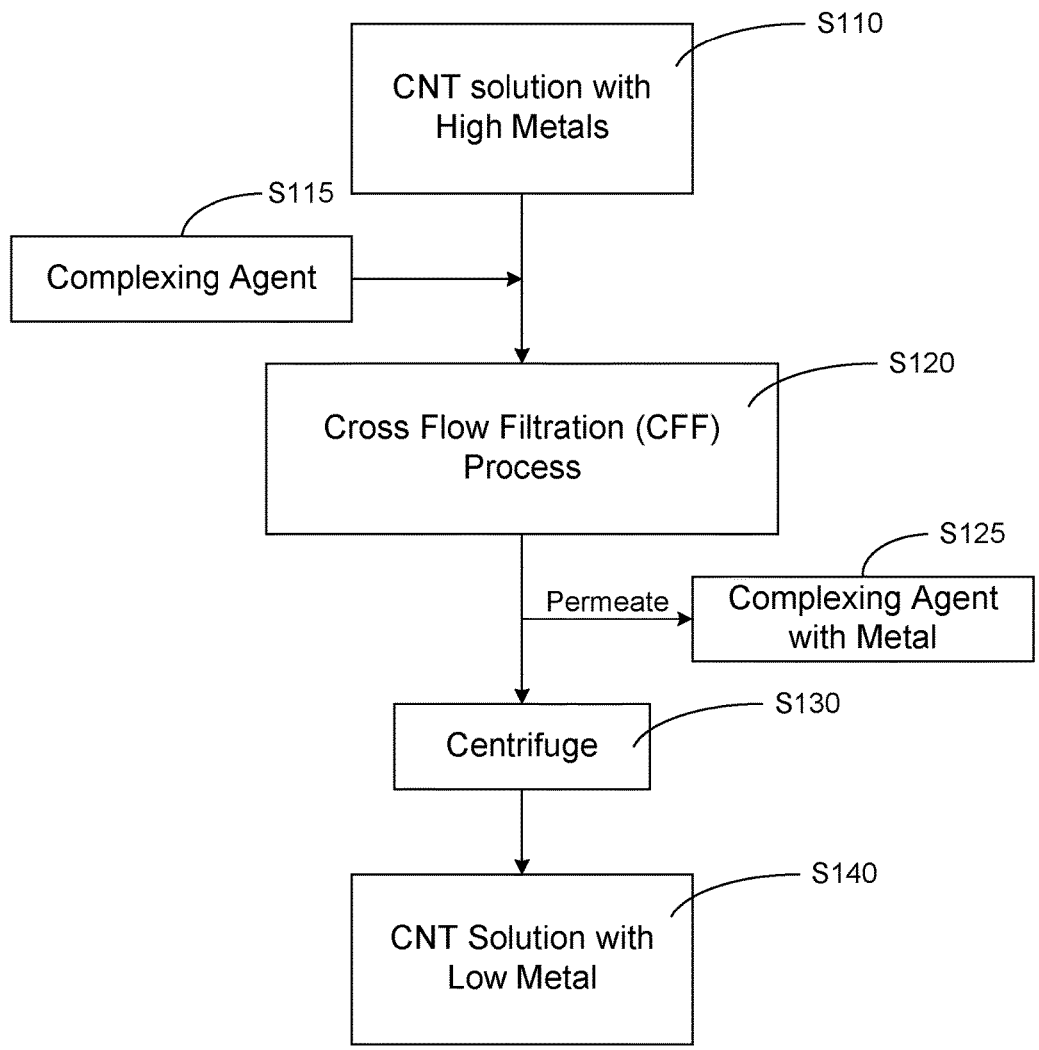
FIG. 1 illustrates a method for producing or purifying a CNT solution in accordance with one embodiment consistent with the present disclosure.

Carbon nanotubes (CNTs) have been under intensive research recently. The electrical, mechanical, and other properties of CNTs make them useful in many applications. For example, as described within U.S. Pat. No. 7,375,369 to Sen et al. and U.S. Patent Publication No. 2006/0204427 to Ghenciu et al., both incorporated herein by reference in their entirety, a nanotube application solution, which includes a plurality of nanotube elements, can be used to form nanotube fabrics and/or films over a semiconductor substrate. A spin coating process, for example, can be used to evenly distribute the nanotube elements over the semiconductor substrate, thereby creating a substantially uniform layer of nanotube elements. In other cases, other processes (such as, but not limited to, spray coating processes or dip coating processes) can be used to apply and distribute the nanotube elements over the substrate element.

In addition, Ghenciu et al. (U.S. Patent Publication No. 2006/0204427) discloses an aqueous applicator liquid including carbon nanotubes and a liquid medium (water). As taught in Ghenciu, nanotube dispersions commonly used for memory and logic applications may have a concentration of about 100 mg/L and an impurity content of less than 0.2 wt %, or less than 0.1 wt % of free metal in pH-controlled water. The selection of nanotube concentrations depends upon the specific types of applications. For example, in the case where a thin monolayer fabric is desired, a more diluted applicator liquid may be spin-coated on a substrate.

One aspect of this particular disclosure concerns the formation of high density nanotube fabric layers on a semiconductor substrate. High density nanotube fabric layers may reveal a much lower surface resistance than that of the nanotube fabrics of normal density. In one application, the high density nanotube fabric layers may be used to construct three-dimensional (3D) semiconductor memory devices. Because a high density nanotube fabric layer may have a lower surface resistance, the 3D memory devices so constructed would consume less power than regular 3D memory devices. For developing high density nanotube fabric layers, a highly concentrated nanotube dispersion may be desirable. For example, a high concentration nanotube dispersion having a concentration of about 333 mg/L or more may be desirable.

However, as the concentration of nanotube dispersions increases to such a high level, several significant challenges arise. First, the requirement for the purity level for these nanotube dispersions also increases because with increased nanotube concentration, increased levels of impurities may be introduced into the nanotube dispersion. For example, in order for nanotube concentrations higher than 333 mg/L to be useful in the semiconductor processing, the nanotube dispersions may have to be purified such that the impurity level is reduced to 0.01 wt % or less. Second, as the concentration of nanotubes increases in the nanotube dispersion with increasing purity levels, stability of the solution can become problematic. As noted in Ghenciu, the conventional approach to improving dispersion of nanotubes in a liquid medium has been to decrease purity by adding in dispersants, such as surfactants, polymers, and the like. However, these impurities lead to undesirable electrical characteristics that would not be suitable in applications such as semiconductor memory devices. Here, purity level is increasing with the added difficulty of increasing nanotube concentration, both of which are conventionally thought to decrease dispersability. It would be difficult to use the purification methods described in Ghenciu to reach such a highly concentrated nanotube dispersion having even increased purity levels.

In some applications, for example, as disclosed in U.S. Patent Publication No. 2008/0012047 to Bertin et al., incorporated herein by reference in its entirety, Bertin teaches a nonvolatile two terminal nanotube switch structure having (in at least one embodiment) a nanotube fabric article deposited between two electrically isolated electrode elements. As Bertin teaches, by placing different voltages across said electrode elements, the resistive state of the nanotube fabric article can be switched between a plurality of nonvolatile states. That is, in some embodiments, the nanotube fabric article can be repeatedly switched between a relatively high resistive state (resulting in, essentially, an open circuit between the two electrode elements) and a relatively low resistive state (resulting in, essentially, a short circuit between the two electrode elements).

The fabrication of an array of such nanotube switching devices can include patterning of a nanotube fabric layer to realize a plurality of these nanotube fabric articles. The porosity of a nanotube fabric layer—or more specifically the size of the voids within a nanotube fabric layer—can limit the feature size to which these nanotube fabric articles can be patterned. For example, to fabricate a nanotube switching device array wherein the individual nanotube switching devices are on the order of 20 nm square (that is, the nanotube fabric article within each device is essentially 20 nm by 20 nm), the porosity of the nanotube fabric array may need to be such that voids within the nanotube fabric layer are on the order of 10 nm. In this way, the fabrication of highly dense nanotube memory arrays (wherein the individual nanotube switching elements within the array are patterned at a sub 20 nm geometry, for example) can require highly dense (that is, less porous with void sizes on the order of 10 nm or less) nanotube fabric layers.

The present disclosure teaches application solutions (dispersions) or carbon nanotube solutions (dispersions) which can be used in the applications discussed above. In one aspect, the carbon nanotube solutions may have a concentration higher than 333 mg/L. In another aspect, the carbon nanotube solutions may have impurity level that is reduced to 0.01 wt % or less. In yet another aspect, the carbon nanotube solutions may have a concentration higher than 333 mg/L and have impurity levels that is reduced to less than 0.01 wt % or less. The present disclosure also teaches methods for removing impurities in the application solutions (dispersions) or carbon nanotube solutions (dispersions). It is noted that this disclosure uses the terms "applicator liquids," "application solutions (dispersions)," and "carbon nanotube solutions (dispersions)" interchangeably to refer to the same thing. The term "carbon nanotube" or "CNT" is used solely for the purpose of enhancing the readability of this disclosure. Accordingly, although the term "carbon nanotube" or "CNT" has been used, it is intended to cover not only "carbon" nanotubes, but also any tubular structure in the nanometer scale made of other materials. Moreover, it is noted that the terms "solution" and "dispersion" may be used interchangeably in this disclosure to refer to the same thing.

CNT synthesis methods typically result in raw nanotube materials in dry powder form. In some embodiments, it may be necessary to suspend, disperse, solvate, or mix the CNT powder in a liquid medium (e.g., an aqueous or non-aqueous solvent) to form a CNT solution or dispersion before use. To form an aqueous CNT solution, it is necessary to dissolve or disperse the CNT powder in water. Nitric acid ($HNO_3$) may be added in the water to oxidize the CNT raw material, and the mixture of nanotubes, nitric acid, and water may be stirred and thereafter refluxed. Then, the acidic nanotube solution may be diluted by distilled or deionized water. To remove the acidic waste and/or some metal ions, the nanotube solution may be centrifuged until all of the nanotubes sediment into the bottom of the centrifuge tube. The CNT sediment may then be added in distilled or deionized water, and the mixture thereof may be sonicated in a chilled bath to disperse the sedimented CNTs into water again. Further, the pH of the redispersed CNT solution may be adjusted using ammonium hydroxide ($NH_4OH$). These processes may be repeated for several times until the pH of the solution is adjusted to about 7.1. The increase in pH of the solution may be beneficial in removing the attached amorphous particles from the sidewalls of the nanotubes. The carbonaceous particles may have a higher affinity for the solution than the nanotubes sidewall at higher pH levels. The nanotube solution may then be sonicated again in a chilled sonication bath so as to form a CNT solution.

As discussed above, the CNT solution may be used as an applicator liquid (or an application solution) to apply carbon nanotubes on a semiconductor substrate so as to form nanotube films and/or nanotube fabrics. In some embodiments, the applicator liquid may be applied to the semiconductor substrate by, for example, spraying or spin-coating the applicator liquid on the semiconductor substrate, or by dipping the semiconductor substrate in the applicator liquid. The CNTs used in one or more embodiments consistent with the present disclosure may be single-walled nanotubes (SWNT), double-walled nanotubes (DWNT), multi-walled nanotubes (MWNT), and/or mixtures thereof.

CNT materials may contain undesirable contaminants. For example, CNT materials may contain metal contaminants as metal catalysts are typically used in CNT production. These metal catalysts are difficult to be completely removed as some are embedded in the CNTs. Typical CNT raw materials contain about 5% of iron (Fe) and other residual metal catalysts even after extensive acid washing with HCl. On the other hand, in the semiconductor industry, there is a stringent requirement for the maximum amount of metal contaminants allowed in the CNT solution. In certain manufacturing processes, the concentration of metal contaminants in the CNT solution must be less than 25 parts per billion (ppb). Accordingly, it is necessary to purify the CNT solution such that the metal impurities contained in the CNT solution can be reduced to an amount below the required maximum value.

In addition, CNT raw materials may contain amorphous carbon as one of the contaminants. Amorphous carbon normally accompanies CNTs as by-products when the CNTs are produced by, for example, chemical vapor deposition (CVD), electric-arc discharge, or laser ablation. Because amorphous carbon may have irregular shapes and/or sizes, their existence in CNT-based semiconductor devices may cause defects in the semiconductor devices and thus renders unexpected behavior in the circuitry. In some embodiments, the defects may be structural defects (e.g., uneven thickness of the nanotube fabric layer, and/or protrusions in the nanotube fabric layer), or electrical defects (e.g., unexpected sheet resistance). Accordingly, amorphous carbon are undesirable.

Further, CNT raw materials may contain silica ($SiO_2$) as one of the contaminants. Extensive sonication process may also transport silica into the CNT solution, if the CNT solution is contained in a quartz- or glass-type container during the sonication process. Silica in the CNT solution appears to be in particle form. Accordingly, if the silica-contaminated CNT solution is used to form a CNT film, the existence of silica particles of sufficient size may become defects in the CNT film. Therefore, a purification process that controls the levels of silica in the CNT solution is desirable. One alternative approach to prevent silica contaminant is to carry out the processing of CNT solutions in metallic vessels. However, such an alternative approach may introduce other impurities, such as metal.

As discussed above, the liquid medium for the CNT solution may be any solvent that is capable of suspending, dispersing, solvating, or mixing the CNTs. In addition, the liquid medium are desirably compatible with existing semiconductor fabrication processes. In one embodiment, the liquid medium of the CNT solution is an aqueous solvent or water (deionized or distilled). It is to be understood that non-aqueous solvents (e.g., organic solvents) may be used as the liquid medium. For example, U.S. Publication Nos. 2005/0058590 and 2005/0269553 to Sen et al., incorporated herein by reference to their entirety, disclose spin-coatable liquids, which can be used to form nanotube films or fabrics of controlled properties. The spin-coatable liquids as taught in Sen may be formed of an aqueous solvent or a non-aqueous solvent.

Nanotube materials may be prepared using existing methods, such as chemical vapor deposition (CVD) or other vapor phase growth techniques (e.g., electric-arc discharge, laser ablation, combustion, and the like). In this disclosure, such nanotube materials may be referred to as nanotube raw materials. It is appreciated, however, that nanotube materials may be pre-treated before being used to form a nanotube dispersion. In this disclosure, the nanotube materials that are used to form a nanotube dispersion may be referred to as starting nanotube materials, which may include pristine or raw nanotubes and/or functionalized nanotubes. In one embodiment, the pre-treatment of nanotubes includes functionalizing the nanotube sidewalls with different kinds of functional groups. For example, Cleavelin et al. (U.S. application Ser. No. 12/874,501), the entire contents of which are incorporated herein by reference, discloses various methods for functionalizing nanotube sidewalls.

Catalysts are typically used to synthesize nanotubes. As a result, the nanotubes are often contaminated with divalent or trivalent metal impurities. Often times, the CNT solutions are also contaminated with other materials, such as amorphous carbon, silica, etc. Accordingly, appropriate purification processes are desirable to remove the contaminants without affecting the chemical structures and/or the electronic properties of the nanotubes.

Removal of Divalent or Trivalent Metal Impurities

One way to reduce metal contaminants in the CNT solution is to extensively treat the CNT solution with nitric acid and thereafter perform a cross flow filtration (CFF) process to the CNT solution under acidic conditions. Nitric acid oxidation opens the end caps of nanotubes and exposes the embedded metals to the acids. As a result, binary metals are solubilized and removed as permeate from the CNT solution during the CFF process. Further, even after the above-mentioned nitric acid treatments and the CFF processes, the concentration of certain metal contaminants, such as calcium (Ca), iron (Fe), zinc (Zn), etc., may still exceed the allowed maximal value. In some cases the materials used to process the solutions, either in the equipment or processing reagents, as well as inadvertent environmental contaminants can limit the level of metallic impurity that can be obtained by practical means. In such cases, the sample may not be useful for the intended application, for example, as thin film materials in advanced semiconductor electronic devices. The generation of this contaminated material inevitably increases the overall production cost of useful CNT solutions.

Moreover, due to the requirement of low metal contaminants in the CNT solution, the CNT solution can be kept in containers, lines, or tubes made of non-metal materials, such as quartz or Teflon. Although metal or stainless steel containers are more robust and are generally more desirable in the fabrication process, using metal or stainless steel containers for the CNT solution may introduce metal contaminants into the CNT solution.

Metal impurities may also be removed by, for example, heating the nanotubes in an acid solution, such as a nitric acid ($HNO_3$) or a hydrochloric acid (HCl), to dissolve the metal impurities. Thereafter, the acid solution containing the dissolved metal impurities may be separated from the nanotubes by performing a first filtration process, such as a first cross flow filtration (CFF1) process, at acidic conditions. Additional acid treatments may be performed to aid the removal of metal impurities. The nanotubes may be further treated with a base, such as ammonia hydroxide ($NH_4OH$), tetramethylammonium hydroxide (TMAH), or other alkyl ammonium bases. The base treatments may render amorphous carbon particles more soluble or dispersed in the liquid medium, thereby separating the amorphous carbon from the CNT solution via subsequent filtration and/or centrifugation processes. The above acid and/or base treatments may be performed in a single step or in multiple steps, and these CFF1 process steps may be repeated for several times.

Although not wishing to be bond by theory, even after extensive acid and/or base treatments, binary metal ions (e.g., $Fe^{++}$, $Ca^{++}$, etc.) may still exist as counter ions for surface carboxylic acid groups, generated from the oxidation of CNT by nitric acid on the CNT surfaces. To remove these binary metal ions, complexing agents may be introduced in the CNT solution. The complexing agents may chelate the binary metal ions from the CNT surfaces. In some embodiments, the complexing agents may be ethylenediaminetetraacetic acid (EDTA), diethylene triamine pentaacetic acid (DTPA), etidronic acid, or combinations thereof. Then, the chelated binary metals may depart from the CNT sidewalls and become soluble in the CNT solution. Thereafter, the chelated binary metals may be removable through, for example, a second cross flow filtration (CFF2) process. These CFF2 filtration processes for metal removal may be repeated for several times.

It should be noted that complexing agents are previously thought to complex not only with metals (or metal ions), but also with carbon nanotubes, which can undesirably affect the electrical properties of the carbon nanotubes. Hence, conventional approaches did not utilize complexing agents. Nevertheless, it has been found that nanotube films formed from nanotube dispersions produced in accordance with the techniques described herein may still exhibit suitable electric properties.

It is noted that complexing agents includes chelating agents and non-chelating agents. In general, complex ions involving multidentate ligands (i.e., chelating agents) are more stable than complex ions with only monodentate ligands.

This is known as the chelate effect. In below Table 1, the formation constant values for various complexes formed by $Cu^{2+}$, $Fe^{2+}$, and $Zn^{2+}$ ions are provided. Table 1 shows the formation constant values by ligand type (i.e., mono-, bi-, or tetra-dentate). As shown in Table 1, the formation constants for complexes involving bidentate and tetradentate ligands tend to be higher than those involving monodentate ligands. One exception is $CN^-$, which is a mondentate ligand. There may be other exceptions, such as CO. $CN^-$ and/or CO may be referred to as pi-acceptor ligands, since the metal-ligand bond is strengthened due to pi-back donation of electrons from metal to ligand.

In this disclosure, it is desirable to select and use those complexing agents having higher formation constants with respect to the metal ions to be chelated or removed from the CNT solutions. In addition, it is also desirable to select and use those complexing agents which can result in water soluble complexes, so as to enable efficient removal of metallic impurities. The complexing agents satisfying the above requirements are normally chelating agents. It is appreciated, however, that some non-chelating agents may be used to satisfy the same requirements. So long as the formation constants of the non-chelating agents are comparable or greater than the formation constants of the chelating agents, such non-chelating agents may be used to the same or similar effect as the chelating agents.

TABLE 1

Complex-Ion Formation Constants ($K_f$) for different Metal Ions.

| Metal Ion | Ligand Type | Ligand symbol | Complex Structure | Complex-Ion Formation Constants ($K_f$) |
|---|---|---|---|---|
| $Cu^{2+}$ | Monodentate | $NH_3$ | $[Cu(NH_3)_4]^{2+}$ | $1.1 \times 10^{13}$ |
| $Cu^{2+}$ | Bidentate | Oxalate ($ox^{2-}$) | $[Cu(ox)_2]^{2-}$ | $3 \times 10^8$ |
| $Cu^{2+}$ | Bidentate | Ethylene-diamine (en) | $[Cu(en)_2]^{2+}$ | $1 \times 10^{20}$ |
| $Cu^{2+}$ | Tetradentate | $EDTA^{4-}$ | $[Cu(EDTA)]^{2-}$ | $2.1 \times 10^{14}$ |

TABLE 1-continued

Complex-Ion Formation Constants ($K_f$) for different Metal Ions.

| Metal Ion | Ligand Type | Ligand symbol | Complex Structure | Complex-Ion Formation Constants ($K_f$) |
|---|---|---|---|---|
| $Fe^{2+}$ | Monodentate | $CN^-$ | $[Fe(CN)_6]^{4-}$ | $1 \times 10^{37}$ |
| $Fe^{2+}$ | Bidentate | en | $[Fe(en)_3]^{2+}$ | $5 \times 10^9$ |
| $Fe^{2+}$ | Bidentate | $ox^{2-}$ | $[Fe(ox)_3]^{4-}$ | $1.7 \times 10^5$ |
| $Fe^{2+}$ | Tetradentate | $EDTA^{4-}$ | $[Fe(EDTA)]^{2-}$ | $2.1 \times 10^{14}$ |
| $Zn^{2+}$ | Monodentate | $NH_3$ | $[Zn(NH_3)_4]^{2+}$ | $4.1 \times 10^8$ |
| $Zn^{2+}$ | Bidentate | $ox^{2-}$ | $[Zn(ox)_3]^{4-}$ | $1.4 \times 10^8$ |
| $Zn^{2+}$ | Bidentate | en | $[Zn(en)_3]^{2+}$ | $1.4 \times 10^{14}$ |
| $Zn^{2+}$ | Tetradentate | $EDTA^{4-}$ | $[Zn(EDTA)]^{2-}$ | $3 \times 10^{16}$ |

Removal of Amorphous Carbon

As discussed above, CNT raw materials may contain amorphous carbon as one of the contaminants. Similar to the purity requirement for metal impurities, in the semiconductor industry, there is a requirement for the maximum amount of amorphous carbon allowed in the CNT solution. Several methods exist to remove amorphous carbon from the CNT solution. For example, a high speed centrifugation process or a filtration process may be performed to remove the amorphous carbon, especially the big particle amorphous carbon since they are heavier than regular CNT particles.

Nanotubes tend to attract each other due to van der Waals interactions (atomic level forces between the individual nanotube elements) or through π-π interactions (a stacking effect due to the presence of free electrons in the π-orbitals along the nanotube structure). Accordingly, nanotubes may bundle together along their sidewalls. In addition, amorphous carbon may be attracted by the nanotubes through similar mechanisms. Further, amorphous carbon may be trapped in the bundles of nanotube elements.

Although filtration and/or a centrifugation processes may remove some amorphous carbon from the CNT solution, an amount of amorphous carbon exceeding the required minimum, especially those amorphous carbon with smaller particle size, may still remain in the CNT solution even after repeating the filtration and/or the centrifugation processes for several times. In order to sufficiently remove amorphous carbon from the CNT solution, some non-metal ionic species may be added in the CNT solution. The ionic species may be, for example, ammonium or tetraalkylammonium as cations; nitrate, formate, acetate, hydroxide, carbonate, or bicarbonate as counter ions or anions; para-aminobenzoic acid (pABA); and/or combinations thereof. In one embodiment, ammonium nitrate salts are added in the CNT solution as the non-metal ionic species.

The ionic species may be dissolved in the CNT solution, thereby introducing charges in the CNT solution and increasing the conductivity (ionic strength) of the CNT solution. For example, when nitrate salts are used and dissolved in the CNT solution, negatively charged nitrate ions ($NO_3^-$) are introduced in the CNT solution. The presence of charged ions or particles may interfere with the van der Waals and the π-π interactions among the nanotubes. As a result, the nanotubes may repel each other at locations where charged particles are present and attract each other at locations where charged particles are absent.

Accordingly, a high concentration of nitrate ions within the CNT solution may separate nanotubes apart from each other and screen the amorphous carbon from the nanotubes. In one embodiment, a nitrate concentration of about 300 ppm or more is considered high. Conversely, a low concentration of nitrate ions within the CNT solution may allow nanotubes in the CNT solution to come together, thereby forming bundled or rafted nanotubes. In one embodiment, a nitrate concentration of about 10 ppm or less is considered low.

In one embodiment, ionic species (e.g., the nitrate salts) are added in the CNT solution after the acid and/or base treatments discussed above. In addition, the ionic species may be added before, after, or simultaneously with the addition of the complexing agents discussed above for the removal of metal impurities. Thereafter, a sonication process may be performed to the CNT solution which contains the ionic species and/or the complexing agents so as to enhance the homogeneity of the nanotube elements dispersed in the CNT solution.

Subsequently, while the nitrate concentration is at a high level, filtration and/or centrifugation processes may be performed to remove the amorphous carbon. Because amorphous carbon are screened from the nanotube elements due to the presence of the nitrate ions, it becomes easier to remove the amorphous carbon from the CNT solution through filtration and/or centrifugation. In one embodiment, the amorphous carbon may be removed in a second cross flow filtration (CFF2) process, which may be repeated for several times.

Removal of Silica

As discussed above, CNT raw materials may contain silica ($SiO_2$) as one of the contaminants. Silica may be introduced through quartz containers, through techniques utilized in synthesizing nanotubes, from nanotube suppliers, and the like. With the high nanotube concentrations in the nanotube dispersions described herein, silica may become even further problematic as smaller silica particles may agglomerate together forming larger aggregates upon deposition of the nanotube film.

Silica may be removed from the CNT solution by using a buffered oxide etch (BOE) or hydrofluoric acid (HF) solution followed by a filtration process. The BOE solution is a wet etchant which may be used to etch and dissolve silicon dioxide ($SiO_2$) or other silicon compounds in the CNT solution. In one embodiment, the BOE solution may be used to treat the nanotube raw materials that are in dry powder form. Alternatively, the BOE solution may be used to treat nanotube dispersions between two successive filtration processes, such as between two cross-flow filtration processes.

Previously, BOE solutions were not considered for the removal of silica in CNT solutions because BOE solutions may also interfere with nanotubes from the CNT solution. For CNT solutions of high nanotube concentrations, however, only an insignificant fraction of the carbon nanotubes would be affected when silica is being etched with a BOE solution. Accordingly, in one aspect of the present disclosure, the BOE solution is used to remove silica impurities so as to purify the CNT solutions.

In one embodiment, the BOE solution comprises hydrofluoric acid (HF). Hydrofluoric acid (HF) may react with silica particles in the CNT solution, so as to form fluorosilicic acid ($H_2SiF_6$) and water ($H_2O$). The reaction chemistry is given as follows:

$$SiO_2 + 6HF \rightarrow H_2SiF_6 + 2H_2O \quad \text{Formula (1)}$$

Because fluorosilicic acid ($H_2SiF_6$) is soluble in water, an aqueous CNT solution may contain fluorosilicic acid after the above reaction.

A filtration process may be performed to the CNT solution so as to separate the CNT elements from the fluorosilicic acid. In one embodiment, the filtration process includes a vacuum filtration process. Vacuum filtration often uses a filter paper to separate solid products from a solvent. The solid products are trapped by the filter paper and the solvent is drawn by vacuum into a flask below the filter paper. For the CNT solution, the vacuum filtration process may prohibit the CNT elements from passing through the filter paper and allow the solvent that contains fluorosilicic acid to pass through the filter paper. As a result, the CNT elements are collected on the filter paper. The collected CNT elements may form a wet CNT filtercake. Alternatively, the collected CNT elements may be in a dry powder form. Because the solvent drawn to the flask contains unwanted contaminants, it may be discarded as waste.

After the vacuum filtration process, the CNT solution may be recovered from the CNT filtercake by washing the CNT filtercake with distilled or deionized water and/or by redispersing and reprocessing the CNT filtercake in basic water. The recovered CNT solution may contain significantly less silica particles as compared with the CNT solution before the BOE treatment. It is noted, however, that the CNT filtercake may be used for other types of functionalization reactions without being recovered. It is also noted that silicon compounds other than silica may be removed through the above BOE treatment.

Further, a sonication process and/or a centrifugation process may be performed to the recovered CNT solution. In order to prevent the introduction of silica particles during the sonication process, a non-quartz container may be used to contain the recovered CNT solution. In one embodiment, the non-quartz container may be a polypropylene bottle. In other embodiments, metal or stainless steel containers may be used to contain the recovered CNT solution.

In alternative embodiments, silica in a CNT solution may be removed by using ionic species, such as nitrate, to treat the CNT solution, followed by a filtration process. Specific examples consistent with the present disclosure are described in more detail as follows.

EXAMPLE 1

Referring to FIG. 1, there is illustrated a method for producing or purifying a CNT solution in accordance with one embodiment consistent with the present disclosure. While different contaminants may be removed in one or more steps consistent with the present disclosure, this particular example focuses on a method that can remove metal contaminants from the CNT solution.

In Step S110, a first CNT solution is provided. The first CNT solution may be prepared by dispersing acid oxidized CNT raw materials in water. In one embodiment, the first CNT solution is contained in a stainless steel container. The first CNT solution may be treated with the above acid and/or base treatments, and thus have a reduced amount of metal impurities. Although the first CNT solution may have been treated with acid and/or base, the first CNT solution is considered to include a high level of metal impurities. In one embodiment, metal impurities of more than 25 ppb by wt. for CNT solution is considered high.

It has been discovered that carbon nanotubes may form stable dispersions in water, if the nanotubes are pre-treated with oxidizing acid to introduce surface charges onto the CNT surfaces. The acid treatment may also reduce metal impurities to a certain predetermined level. To enhance the homogeneity of the nanotube dispersions, one or more steps of sonicating the CNT solution may be performed. Alternatively or additionally, one or more steps of grinding and/or agitating may be performed to enhance the homogeneity.

Figure 2:
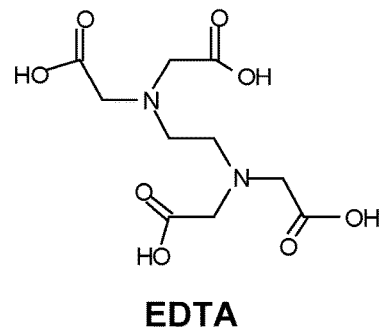
FIG. 2 illustrates the chemical structures of exemplary complexing agents which may be used in purification methods consistent with the present disclosure.
Figure 2:
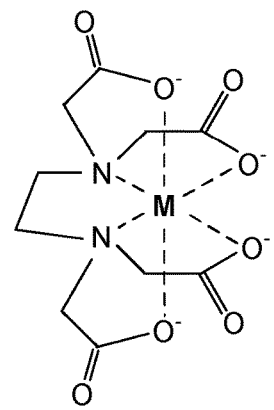
Figure 2:
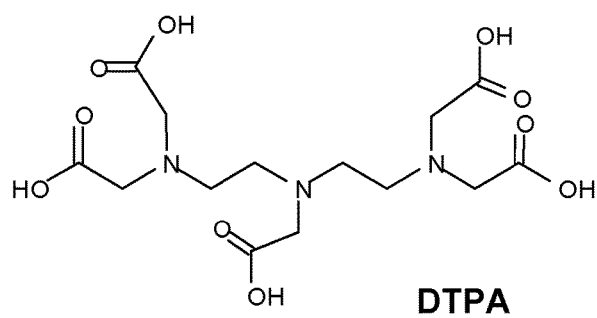
Figure 2:
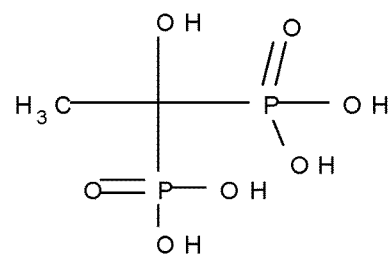

In Step S115, one or more complexing agents are added to or mixed with the first CNT solution. In some alternative embodiments, the first CNT solution may be added to a container holding the complexing agents. As discussed above, the complexing agents may be, for example, one or more of ethylenediaminetetraacetic acid (EDTA), diethylene triamine pentaacetic acid (DTPA), etidronic acid, and/or combinations thereof. FIG. 2 illustrates the chemical structures of the exemplary complexing agents discussed above.

The complexing agents may be added to the first CNT solution before, after, and/or between the sonicating, grinding, and/or agitating processes. In one embodiment, a complexing agent is added before the sonicating process. After mixing the complexing agent with the first CNT solution, the first CNT solution may be sonicated for about 30 minutes in a chilled sonication bath at about 15° C. (or at any temperature within the range of about 5-25° C.). The sonication process may enhance the homogeneity of the nanotube dispersions and, at the same time, allow the complexing agent to effectively mix with and therefore chelate the binary metal remaining on the CNT surfaces. Normally, the complexing agent can form complexes with binary metal ions such that they cannot react with other elements. In addition, the complexing agent and the chelated binary metal may form a composite molecule (as shown in FIG. 2B) that is free from the CNT surfaces and is soluble in water.

Figure 3:
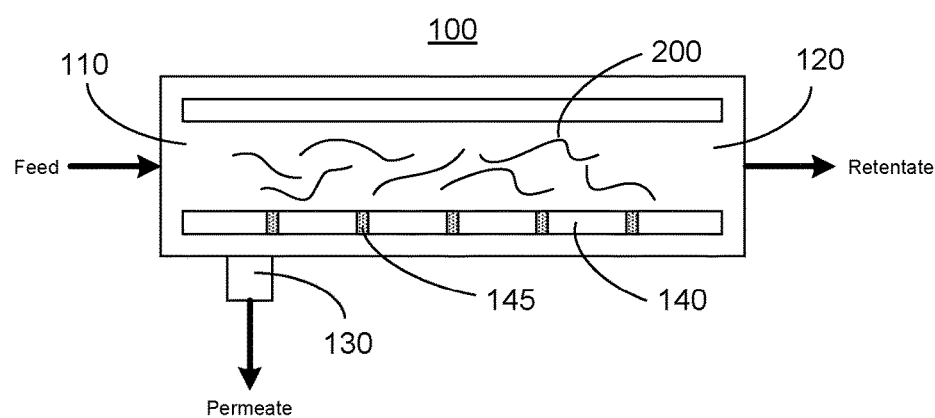
FIG. 3 illustrates a sectional view of a filtration device for performing a cross flow filtration process in accordance with one embodiment consistent with the present disclosure.

Once the sonication process is completed, a cross flow filtration or other suitable filtration process that allows for the separation of the CNTs from the contaminant laden liquid fraction, may be performed in Step S120. In one embodiment, the cross flow filtration process is performed in a filtration device 100 illustrated in FIG. 3. As shown in FIG. 3, filtration device 100 includes an inlet 110, an outlet 120, an exhaust 130, and a membrane 140 having a plurality of pores 145. In one embodiment, membrane 140 may be made of a ceramic material. Because carbon nanotubes 200 may have a length of about 1.2 microns or more, pores 145 of membrane 140 may have a diameter smaller enough to prevent nanotubes 200 from permeating out of membrane 140. Suitable pore sizes may be ranging from about 0.2 microns to about 2 microns. In one embodiment, the diameter of pores 145 is about 0.6 microns, and the membrane is made with porous alumina.

In Step S120, the cross flow filtration process is performed by feeding the first CNT solution into inlet 110. Some liquid medium of the first CNT solution may pass through pores 145 of membrane 140. The liquid medium that passes through pores 145 is called a permeate. The permeate flows out of filtration device 100 from exhaust 130 and is rejected in Step S125. Because complexing agents are soluble in water, the permeate may include the complexing agents that have reacted with the binary metal from the CNT surfaces.

The liquid medium that does not pass through pores 145 is called a retentate. The retentate exits filtration device 100 through outlet 120 and is recovered. Because binary metals may be removed in the permeate, the recovered retentate may include fewer metal impurities as compared with the first CNT solution before adding the complexing agent and before performing the cross flow filtration process. Subsequently, Step S120 may be repeated for several times so as to produce a second CNT solution with a desired purity level for certain metallic impurities. As a result, the second CNT solution may contain significantly less metal impurities than the first CNT solution. Steps S115, S120, and/or S125 may be repeated for multiple times until a concentration of each of the individual metal impurities become lower than a predetermined concentration (e.g., 25 ppb). In one embodiment, Steps S115, S120, and S125 are repeated for two or more times. In another embodiment, only Steps S120 and S125 are repeated for two or more times, after Step 150 is performed once. Although Step S120 has been described as a process to remove metal impurities, it is to be understood that Step S120 may also remove amorphous carbon and other small particles in the first CNT solution.

The second CNT solution obtained from Steps S115, S120, and S125 may still include larger particles (e.g., molecular weight species). Accordingly, in Step S130, centrifugation may be performed to the second CNT solution so as to remove these larger particles. To ensure that the second CNT solution is not contaminated again after this centrifugation step, the solution may be transferred to a container through a pump process, thereby avoiding any possible human contamination or other extraneous contaminants.

Subsequently, in Step S140, a third CNT solution is obtained. The third CNT solution includes a low level of metal contaminants and is substantially free from amorphous carbon and other large and small particles. Although Step S120 may be performed for several times to permeate the complexing agents and the binary metals, once added, it is very difficult to exhaust all of the complexing agents from the CNT solution. Accordingly, the third CNT solution may still contain a very small amount of residual complexing agents. Regardless of the amount, the existence of residual complexing agents in the third CNT solution may indicate that the third CNT solution has been treated with complexing agents. In one embodiment, a residual complexing agent contained in the third CNT solution may have a concentration of less than 25 ppb.

Several experiments have been done to purify CNT solutions or dispersions with complexing agents. The experimental results are summarized in Table 2. The numerical data given in Table 2 are in the unit of parts per billion (ppb), which may be converted to the unit of atoms per centimeter cube (atoms/cm$^3$) for particular metal elements. For example, iron has a molecular weight of 56, and 1 ppb of iron impurities in water is equivalent to 1 gram of iron atoms in $10^9$ grams of water. Because 1 gram of iron contains about $1.07 \times 10^{22}$ atoms, i.e., $6.022 \times 10^{23}$ (the Avogadro constant)/56 (the molecular weight of iron), and $10^9$ grams of water is equivalent to about $10^9$ cm$^3$ of water. Accordingly, 1 ppb of iron contaminant is equivalent to about $10^{13}$ atoms/cm$^3$ for iron.

TABLE 2

Experimental results for CNT solutions treated with complexing agents.

|    | Original | Control | EDTA | DTPA |
|----|----------|---------|------|------|
| Na | <1       | 3       | 8    | 19   |
| Mg | 8.4      | 12      | 6    | 11   |
| Al | 4.5      | 10      | 3    | 6    |
| K  | <1       | 2       | 1    | 2    |
| Ca | 27       | 30      | 6    | 16   |
| Ti | <1       | 4       | <1   | <1   |
| Cr | 30       | 12      | 6    | 8    |
| Mn | 5.3      | 4       | <1   | <1   |
| Fe | 200      | 53      | 5    | 5    |
| Co | <1       | <1      | <1   | <1   |
| Ni | 17       | 9       | 1    | <1   |
| Cu | 2.6      | 4       | 2    | 1    |
| Zn | 9.1      | 8       | <1   | <1   |

The "Original" column in Table 2 shows the measurement results of metal impurity levels for the first CNT solution prepared in Step S110, before Steps S115, S120, and S125 are performed. Accordingly, the metal impurity levels shown in the "Original" column are for the CNT solution not being treated with complexing agents. The measurement results show that the first CNT solution contains a calcium impurity level of about 27 ppb and an iron impurity level of about 200 ppb. Such iron and calcium impurity levels cannot satisfy the stringent requirements in modern semiconductor processing. Accordingly, further purification is required.

The "EDTA" column in Table 2 shows the measurement results of metal impurity levels for the second CNT solution, that is, after using EDTA as the complexing agent in Step S115. The measurements are taken after Steps S115, S120, and S125 have been performed and repeated for two or more times. The measurement results show that the second CNT solution contains a calcium impurity level of about 6 ppb and an iron impurity level of about 5 ppb. These metal impurity levels are substantially lower than those in the "Original" column and thus satisfy the ppb requirement. Accordingly, the second CNT solution so produced is pure enough to be acceptable for most semiconductor processing.

The "DTPA" column in Table 2 shows the measurement results of metal impurity levels for the second CNT solution using DTPA as the complexing agent in Step S115. The measurements are taken after Steps S115, S120, and S125 have been performed and repeated for two or more times. The measurement results show that the second CNT solution contains a calcium impurity level of about 16 ppb and an iron impurity level of about 5 ppb. These metal impurity levels are substantially lower than those in the "Original" column and satisfy the 25 ppb requirement. Under the conditions utilized in this example, the metal impurity levels in the "DTPA" column are higher than those in the "EDTA" column. However, the effectiveness of one complexing agent relative to another will depend upon the complexation conditions of pH, solvent and other factors affecting the binding constants of these polydentate ligands.

The "Control" column in Table 2 shows the measurement results of metal impurity levels for the second CNT solution without using any complexing agent in Step S115. The measurements are taken after Steps S115, S120, and S125 have been performed and repeated for two or more times. The measurement results show that the second CNT solution contains a calcium impurity level of about 30 ppb and an iron impurity level of about 53 ppb. Although the iron impurity level in the "Control" column is lower than that in the "Original" column, the significant enhancement in metal reduction using the complexing agent demonstrates its benefit, i.e., 6 vs. 53 ppb. Further comparison shows a similar improvement in both complexing agents for the reduction of calcium relative to the Control.

Because the present disclosure provides a method for efficiently removing metal impurities in contaminated samples, one advantage of the present disclosure is that more types of containers (especially metal containers) may be used in the manufacturing process. Further, because less process steps are required for the purification process consistent with the present disclosure, another advantage of the present disclosure is the reduction of fabrication cost.

EXAMPLE 2

Figure 4:
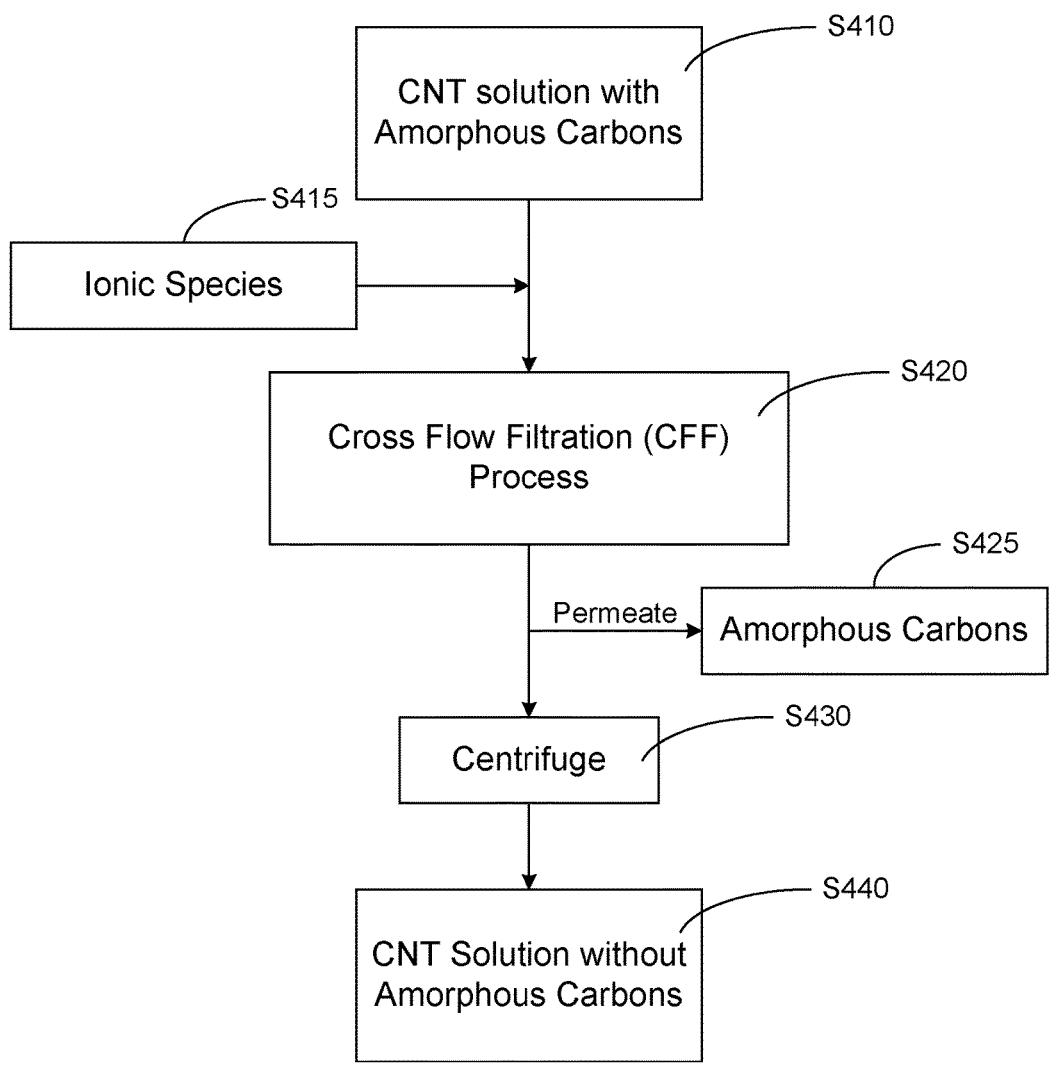
FIG. 4 illustrates a method for producing or purifying a CNT solution in accordance with another embodiment consistent with the present disclosure.

Referring to FIG. 4, there is illustrated a method for producing or purifying a solution of carbon nanotubes in accordance with another embodiment consistent with the present disclosure. While different contaminants may be removed in one or more process steps consistent with the present disclosure, this particular example focuses on a method that can remove amorphous carbon from the CNT solution.

In Step S410, a first CNT solution is provided. The first CNT solution may be prepared by dispersing CNT raw materials in water. The first CNT solution may be treated with the acid and/or base treatments described above and may have undergone conventional filtration and/or centrifugation processes. Accordingly, the first CNT solution may already have a reduced amount of amorphous carbon. However, the first CNT solution may still be considered as having a high level of amorphous carbon, because many amorphous carbon are attracted by the nanotube elements through the van der Waals and/or the $\pi$-$\pi$ interactions, and thus cannot be removed using conventional methods.

In Step S115, non-metallic ionic species may be added to the first CNT solution. As discussed above, the ionic species may be, for example, ammonium or tetraalkylammonium as cations; nitrate, formate, acetate, hydroxide, carbonate, or bicarbonate as counter ions or anions; and/or combinations thereof. In this particular embodiment, nitrate salts (anions) are used as the ionic species. In alternative embodiments, the ionic species may be alkyammonium salt, which can be described as $N(R_1R_2R_3R_4)$, where $R_1$ through $R_4$ can be individually selected from H, or C1 to C10 alkyl radicals. In addition, $R_1$ through $R_4$ may also be any hydrocarbon attachments to nitrogen (N), such as a polymer, an oligomer, or other moieties, where the direct bonding to the N is through a single C—N bond. Examples of ionic species include tetramethylammonium, tetraethylammonium, dimethyldiethylammonium, etc.

The ionic species may be added to or mixed with the first CNT solution before, after, and/or during a sonication process. In some alternative embodiments, the first CNT solution may be added to a container holding the ionic species. In one embodiment, the ionic species may be added before the sonication process. The ionic species may also be added together with the complexing agents discussed above. After mixing the ionic species with the first CNT solution, the first CNT solution may be sonicated for about 30 minutes in a chilled sonication bath at about 15° C. The sonication process may enhance the homogeneity of the nanotube dispersions and, at the same time, allow the amorphous carbon to move away from the CNT surfaces.

Once the sonication process is completed, a cross flow filtration process may be performed in Step S420. The cross flow filtration process may be performed in a filtration device 100 as discussed above with respect to FIG. 3. In Step S420, the cross flow filtration process may be performed by feeding the first CNT solution into inlet 110. Some liquid medium of the first CNT solution may pass through pores 145 of membrane 140 and is called a permeate. The permeate contains amorphous carbon and is rejected in Step S125.

The liquid medium that does not pass through pores 145 is called a retentate and is recovered. Because some amorphous carbon particles are removed in the permeate, the recovered retentate includes fewer amorphous carbon as compared with the first CNT solution before adding the ionic species and before performing the cross flow filtration process. Subsequently, Step S420 may be repeated for several times so as to further purify the first CNT solution and to produce a second CNT solution with a desired purity level for amorphous carbon. As a result, the second CNT solution may contain significantly fewer amorphous carbon than the first CNT solution. Steps S415, S420, and/or S425 may be repeated for multiple times until a concentration of the amorphous carbon become lower than a predetermined concentration (e.g., 10 ppm). In one embodiment, Steps S415, S420, and S425 are repeated for two or more times. In another embodiment, only Steps S420 and S425 are repeated for two or more times after Step S415 is performed once. Although Step S420 has been described as a process to remove amorphous carbon, it is to be understood that Step S420 may also remove other particles in the first CNT solution at the same time.

The second CNT solution obtained from Steps S415, S420, and S425 may still include an excessive amount of amorphous carbon and other particles (e.g., molecular weight species). Accordingly, in Step S430, centrifugation is performed to the second CNT solution so as to further remove the amorphous carbon and those other particles.

Subsequently, in Step S440, a third CNT solution is obtained. The third CNT solution so obtained is substantially free from amorphous carbon and other large and/or small particles. Although Step S420 may be performed for several times to remove amorphous carbon and ionic species, once added, it is very difficult to completely exhaust the ionic species from the CNT solution. Accordingly, the third CNT solution may still contain a small amount of residual ionic species (e.g., less than or equal to 200 parts per million per mole (ppm/mole) or preferably 0-100 ppm/mole). Regardless of the amount, the existence of residual ionic species in the third CNT solution may indicate that the third CNT solution has been treated with the ionic species. Accordingly, the existence of the residual ionic species may be an indication that the third CNT solution has been treated with ionic species to remove amorphous carbon.

EXAMPLE 3

Figure 5:
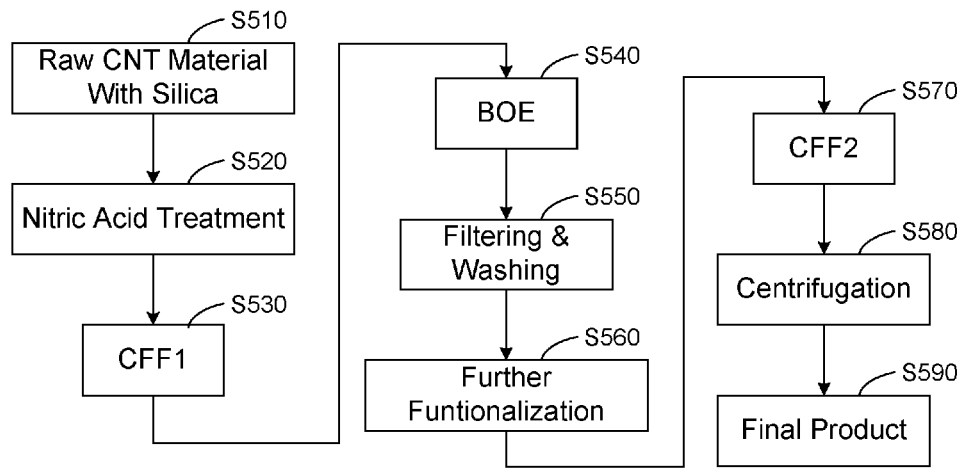
FIGS. 5 and 6 illustrate methods for producing or purifying a CNT solution in accordance with other embodiments consistent with the present disclosure.
Figure 6:
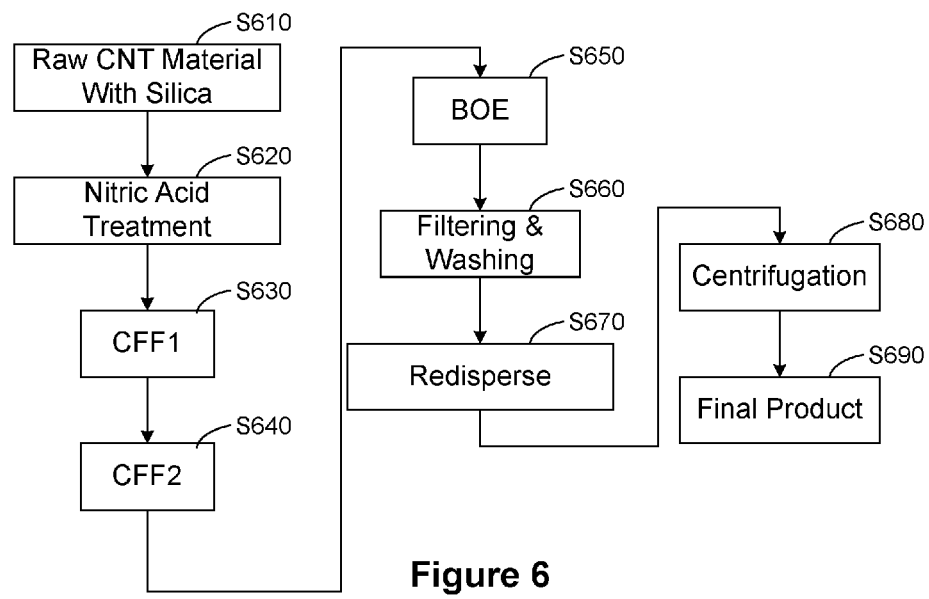

FIGS. 5 and 6 illustrate methods for producing or purifying a solution of carbon nanotubes in accordance with embodiments consistent with the present disclosure. While different contaminants may be removed in one or more process steps consistent with the present disclosure, this particular example focuses on methods that can remove silica particles from the CNT solution.

Referring first to FIG. 5, a CNT raw material (or a CNT starting material) is provided in Step S510. The CNT raw material normally contains silica particles in an amount significantly beyond the acceptable range. Accordingly, it is desirable to remove these silica particles.

In Step S520, the CNT raw material may be treated with a nitric acid so as to disperse or dissolve the CNT raw materials in water, thereby forming a first CNT solution. In Step S530, a first filtration process, such as a first cross flow filtration (CFF1) process, may be performed to the first CNT solution. The first filtration process may be repeated for several times. As a result, some contaminants, such as metal impurities, amorphous carbon, and silica particles, may be removed from the first CNT solution. Subsequently, the retentate from the CFF1 cross flow filtration process may be recovered to form a second CNT solution.

The second CNT solution may still contain excessive silica particles that cannot be removed by the CFF1 cross flow filtration process. In addition, after the CFF1 cross flow filtration process, extensive sonication may be performed to the second CNT solution, which may be held in a quartz container. Accordingly, the sonication process may introduce additional silica particles in the second CNT solution.

In Step S540, a buffered oxide etch (BOE) treatment may be performed to the second CNT solution, so as to further remove the silica particles. In this particular example, the BOE solution used for performing the treatment consists of a 6:1 volume ratio of 40% $NH_4F$ in water to 49% HF in water. It is to be understood that HF is the active ingredient in the BOE solution and that the concentration of HF may vary depending on the desired etching speed. In this example, the BOE treatment is done by adding in the second CNT solution a BOE solution (or mixing the second CNT solution with the BOE solution), such as a solution of hydrofluoric acid (HF). Hydrofluoric acid (HF) may react with silica particles in accordance with Formula (1) discussed above to form fluorosilicic acid ($H_2SiF_6$) in the second CNT solution. It is noted that, in other embodiments, the BOE treatment may be performed before and/or after the nitric acid treatment in Step S520. In some alternative embodiments, the second CNT solution may be added to the BOE solution.

Subsequently, in Step S550, filtering and washing processes may be performed to the CNT solution so as to separate the CNT elements from the liquid medium containing the fluorosilicic acid. In this example, a vacuum filtration process is used for the filtering process. The vacuum filtration process uses a filter paper to separate CNT elements from the liquid medium or solvent of the second CNT solution. As a result, the CNT elements are collected on the filter paper to form a wet CNT filtercake and the filtered solvent containing unwanted contaminants is trashed. Thereafter, the CNT filtercake is washed with distilled or deionized water, and redispersed and/or reprocessed to form a third CNT solution. The third CNT solution may contain significantly less silica particles as compared with the second CNT solution.

Subsequently, in Step S560, the third CNT solution may be further functionalized in accordance with the desired electrical, optical, and/or mechanical properties of the CNT elements. Detailed discussions for the functionalization of carbon nanotubes may be found in, for example, U.S. patent application Ser. No. 12/874,501, filed on Sep. 2, 2010, the entire contents of which are incorporated herein by reference. It is noted, however, that other embodiments consistent with the present disclosure may not require the functionalization process in Step S560.

In Step 570, a second filtration process, such as a second cross flow filtration (CFF2) process, may be performed and repeated for several times. The CFF2 process may be identical or similar to the filtration process in Step S120 of Example 1 and/or the filtration process in Step S420 of Example 2. In each of the CFF processes, nitrate level of the CNT solutions may be reduced. Accordingly, in some cases, it may be necessary to increase the nitrate level in the CNT solutions and carry out one more CFF2 step.

Further, in Step S580, centrifugation is performed to the third CNT solution so as to further remove other contaminants. It is appreciated that, in some cases, it may be necessary to perform a third cross flow filtration (CFF3) process using membranes of a different pore size, such as 10 nm. Subsequently, in Step S590, a final CNT solution (final product) is obtained. The final product is substantially free from silica and other particles.

Referring now to FIG. 6, there is illustrated an alternative method for removing the silica particles. In contrast to the method shown in FIG. 5, the CFF2 process in this alternative method is performed after the CFF1 process and before the BOE treatment. In addition, this alternative method replaces the functionalization process of FIG. 5 by a redispersion process.

In Step S610, a CNT raw material (or a CNT starting material) is provided. The CNT raw material may contain an excessive amount of silica particles, which are to be removed.

In Step S620, the CNT raw material is treated with a nitric acid so as to disperse or dissolve the CNT raw materials in water, thereby forming a first CNT solution. In Step S630, a first filtration process, such as a first cross flow filtration (CFF1) process, is performed to the first CNT solution so as to remove certain contaminants in the first CNT solution. The first filtration process may be repeated for several times, and a second CNT solution is obtained.

In Step S640, a second filtration process, such as a second cross flow filtration (CFF2) process, may be performed to the second solution so as to remove certain contaminants in the second CNT solution. The second filtration process may be repeated for several times, and a third CNT solution is obtained.

The third CNT solution may contain excessive silica particles that cannot be removed by the CFF1 and CFF2 processes. In addition, before and/or after the CFF1 and CFF2 processes, extensive sonication may be performed to the CNT solutions or dispersions. Because the CNT solutions or dispersions may be contained in a quartz container, the sonication processes may introduce silica particles in the CNT solutions or dispersions. It is noted that, in each of the CFF processes, nitrate level of the CNT solutions may be reduced. Accordingly, in some cases, it may be necessary to increase the nitrate level in the CNT solutions and carry out one more CFF2 step.

In Step S650, a BOE solution, such as a hydrofluoric acid (HF) solution, may be used to treat the third CNT solution. Hydrofluoric acid (HF) may react with the silica particles and form fluorosilicic acid ($H_2SiF_6$) in the second CNT solution. As a result, the silica particles may be dissolved in the CNT solution. It is noted that, in other embodiments, the BOE treatment may be performed before and/or after the nitric acid treatment in Step S620.

Subsequently, in Step S660, filtering and washing processes may be performed to the CNT solution so as to separate the CNT elements from the liquid medium containing the fluorosilicic acid. In this example, a vacuum filtration process is used for the filtering process. The vacuum filtration process uses a filter paper to separate CNT elements from the liquid medium or solvent of the second CNT solution. As a result, the CNT elements are collected on the filter paper to form a wet CNT filtercake and the solvent containing unwanted contaminants is trashed. Thereafter, the CNT filtercake may be washed with distilled or deionized water.

In Step S670, the CNT filtercake may be re-dispersed in water to form a fourth CNT solution. The fourth CNT solution contains significantly fewer silica particles as compared with the first, the second, and/or the third CNT solutions or dispersions. Further, in Step S680, centrifugation is performed to the fourth CNT solution so as to further remove other contaminants, and in Step S690, a final CNT solution (final product) is obtained. The final product may be substantially free from silica and other particles.

Because a BOE solution has been used to produce the final product, a very small, detectable amount of residual BOE solution may remain in the final product even after extensive filtration processes. Regardless of the amount, the existence of residual BOE solution in the final product may indicate that the final product has been treated with the BOE solution.

Figure 7:
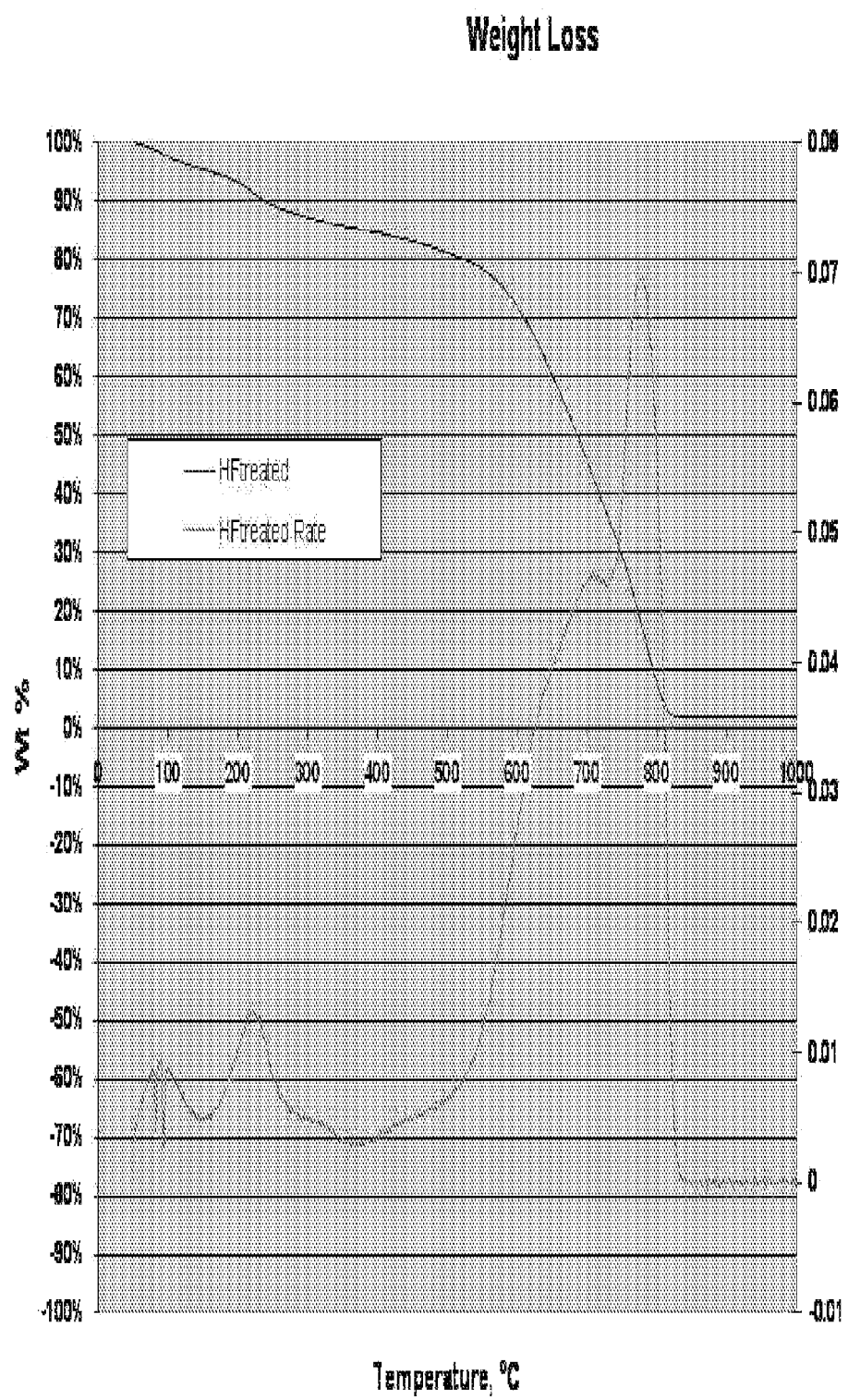
FIG. 7 is a diagram illustrating results for the thermal gravimetric analysis (TGA) of a CNT solution treated with a buffer oxide etch (BOE) solution, in accordance with one embodiment consistent with the present disclosure.

Referring to FIG. 7, there is illustrated the result of thermal gravimetric analysis (TGA) performed to a final product of CNT solution after performing the BOE treatments discussed above. The TGA is performed under oxidative conditions, that is, carbon (CNTs) are burned off at high temperatures. The remaining substances, primarily silica particles, are then measured and weighed. In FIG. 7, the upper curve indicates the percentage of materials remaining at certain temperatures, and the lower curve indicates the percentage change (slope) of the upper curve.

Typically, under the TGA, a CNT solution not being treated with BOE would produce about 20-30% w/w of residues at high temperatures. As illustrated in FIG. 7, if the CNT solution is treated with a BOE solution, the TGA result shows that only about 2% residues remain at a temperature beyond about 800° C. This demonstrates that the BOE treatments discussed above may have effectively removed silica particles in the CNT solution.

Figure 8A:
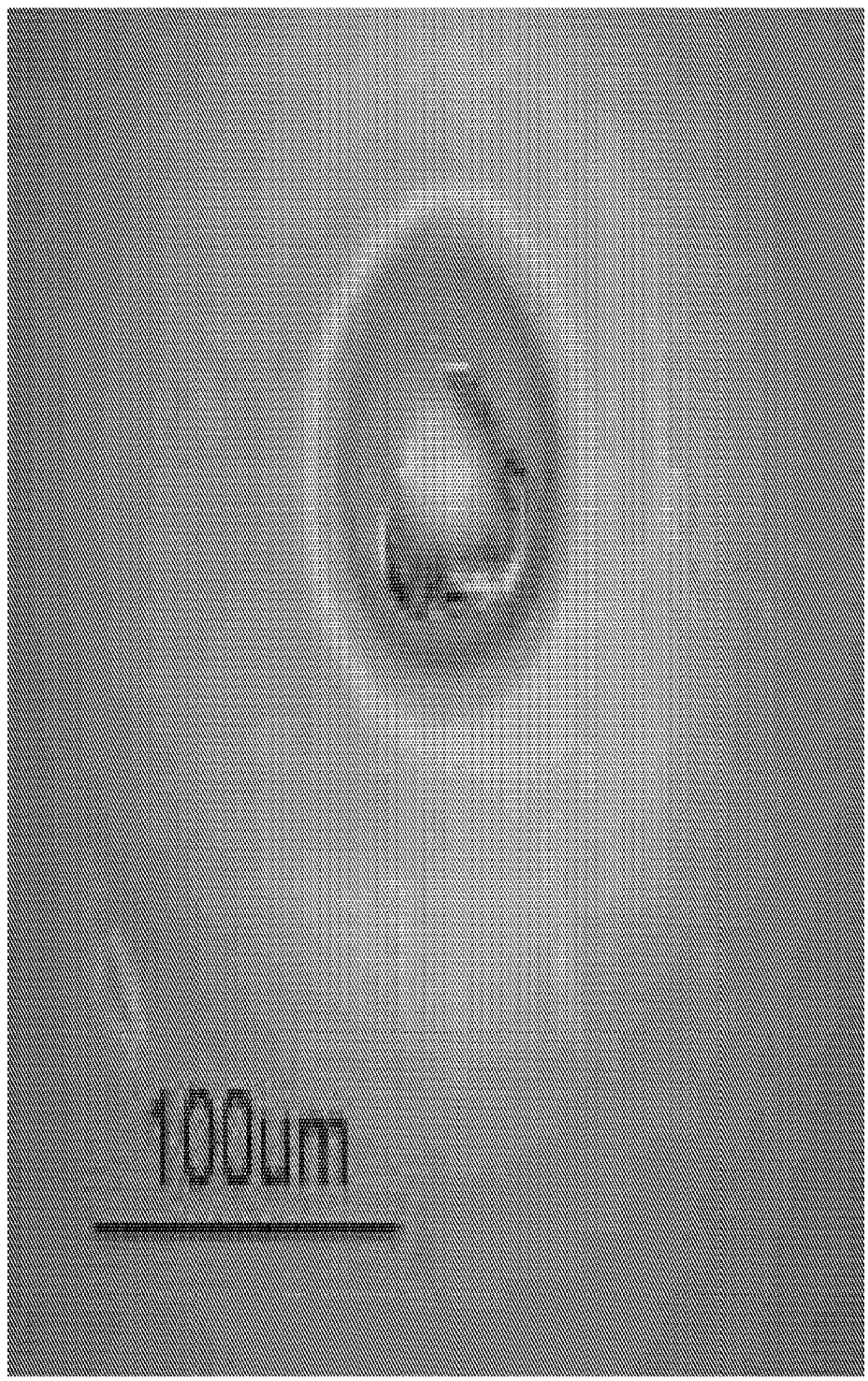
FIGS. 8A through 8C are images of particle-type defects in a CNT fabric taken by an optical microscope or a scanning electron microscope.
Figure 8B:
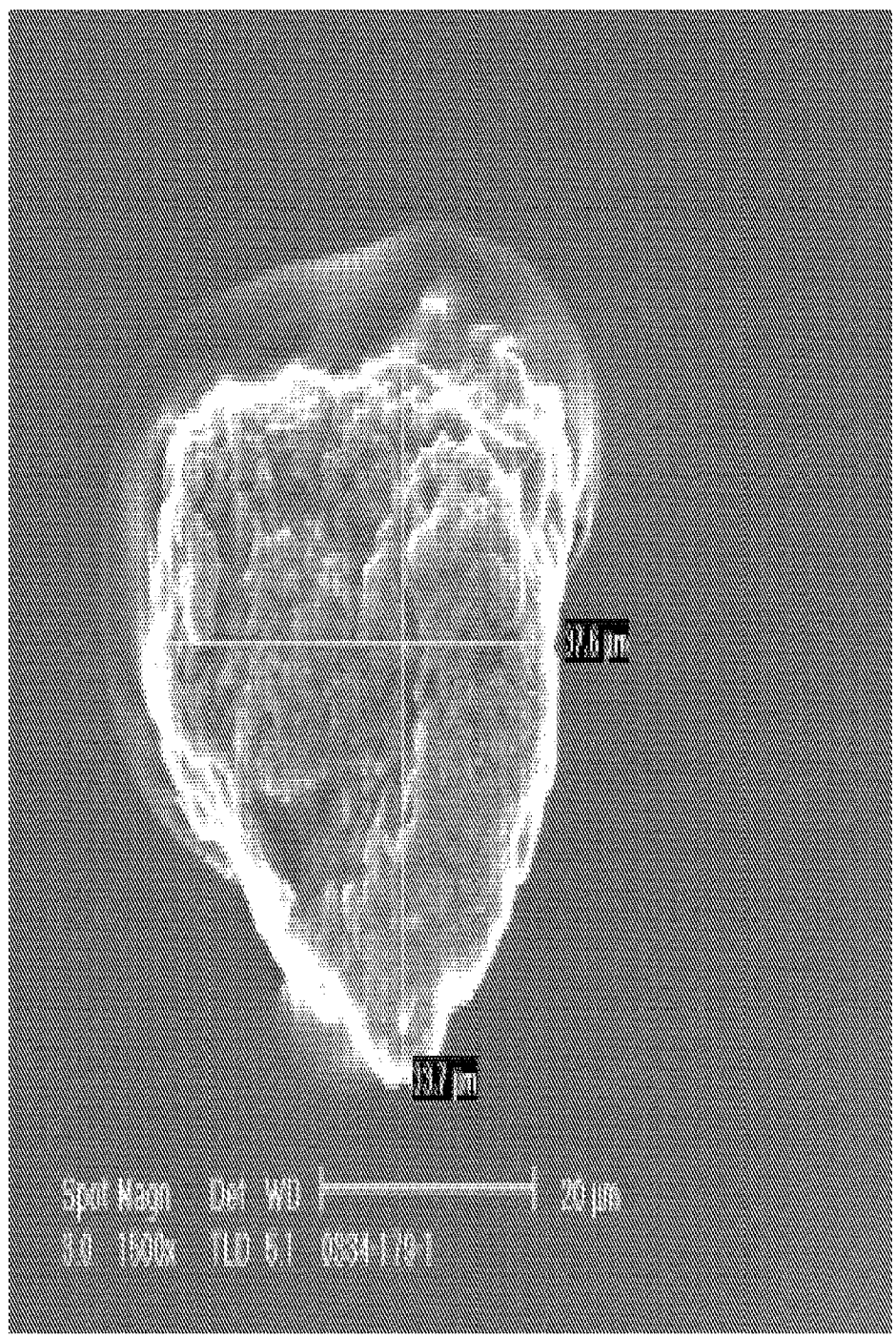
Figure 8C:
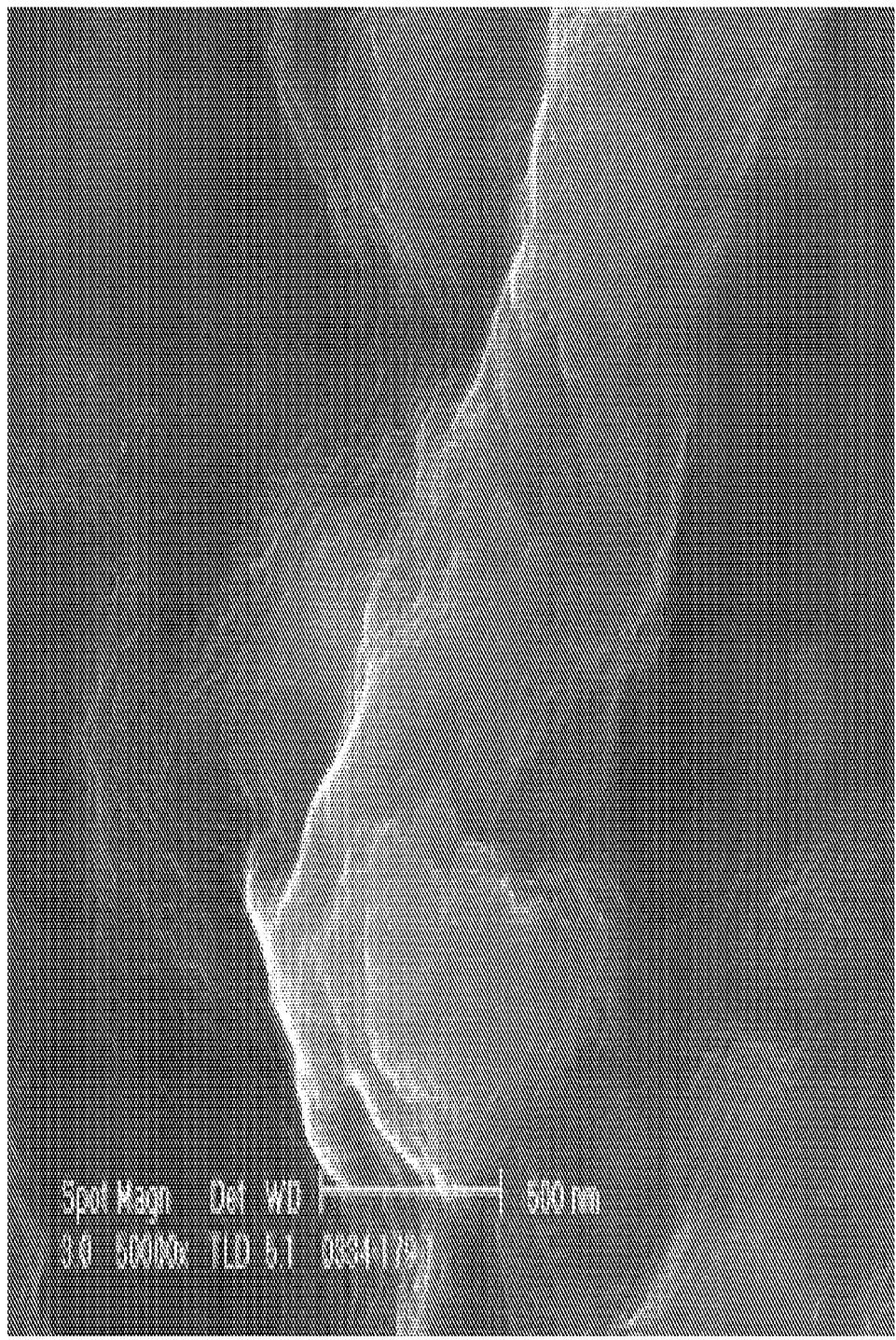

Referring to FIGS. 8A through 8C, there are illustrated pictures of particle-type, hard-center defects in a CNT fabric taken by an optical microscope or a scanning electron microscope. As shown, the particle-type defects may be fully coated with CNTs (FIG. 8B) or partially coated with CNTs (FIG. 8C). These defects may be found in CNT fabrics, if the CNT fabrics are formed by a CNT solution not being treated with BOE.

Figure 9A:
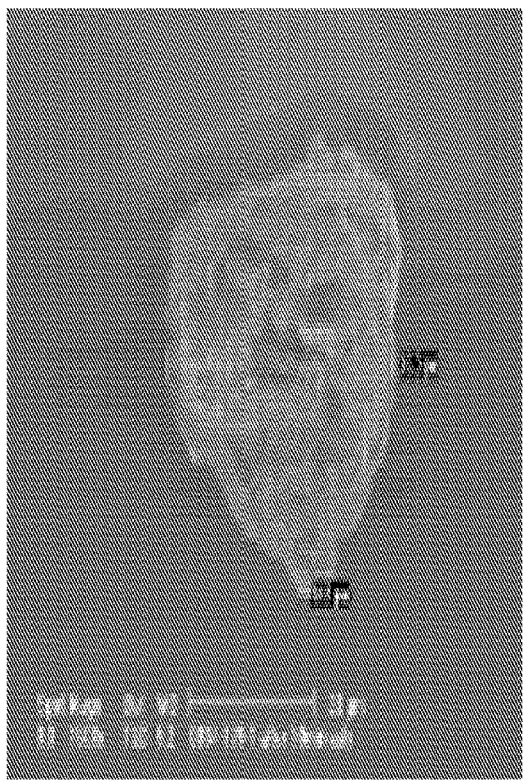
FIGS. 9A and 9B are images of particle-type defects in a CNT fabric treated with oxygen plasma.
Figure 9B:
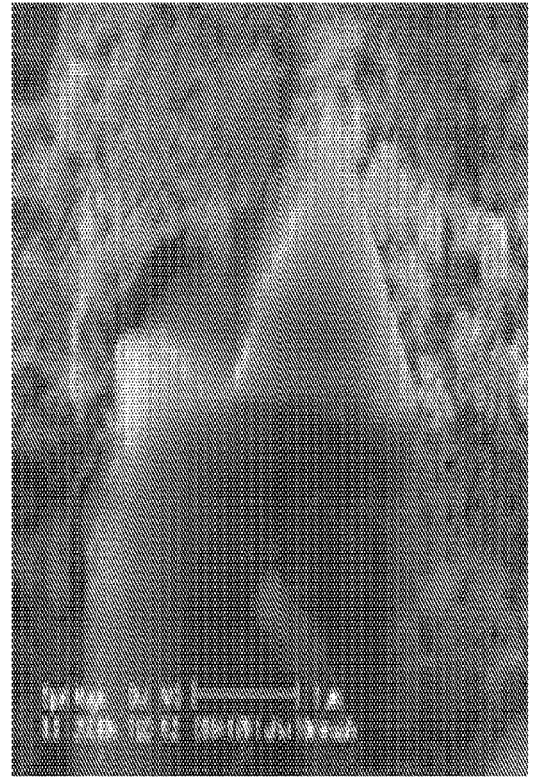

Referring to FIGS. 9A and 9B, there are illustrated images of particle-type, hard-center defects in a CNT fabric after an oxygen plasma treatment. The oxygen plasma treatment may remove all carbon (including carbon nanotubes) in the CNT fabrics so as to reveal the particle defects. Because FIGS. 9A and 9B show the faceted nature for silica or quartz particles, it is confirmed that the defects embedded in the CNT fabrics are indeed silica particles.

Figure 10A:
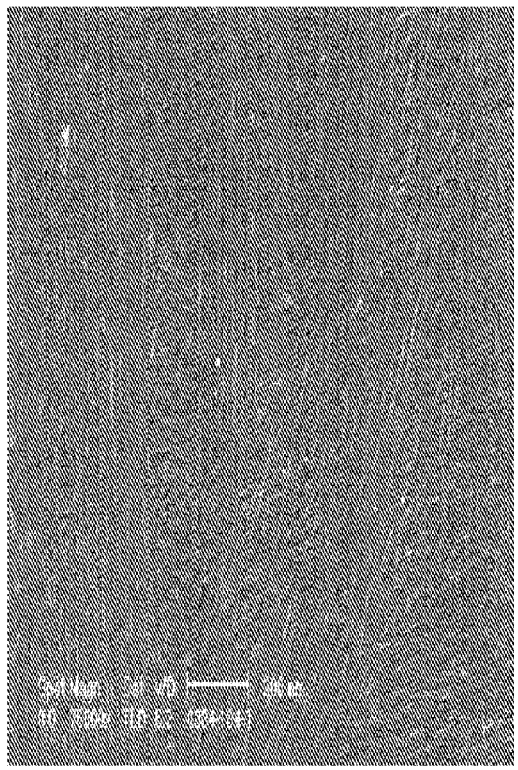
FIG. 10A illustrates an image of a CNT fabric formed by using a CNT solution not treated with a BOE solution.
Figure 10B:
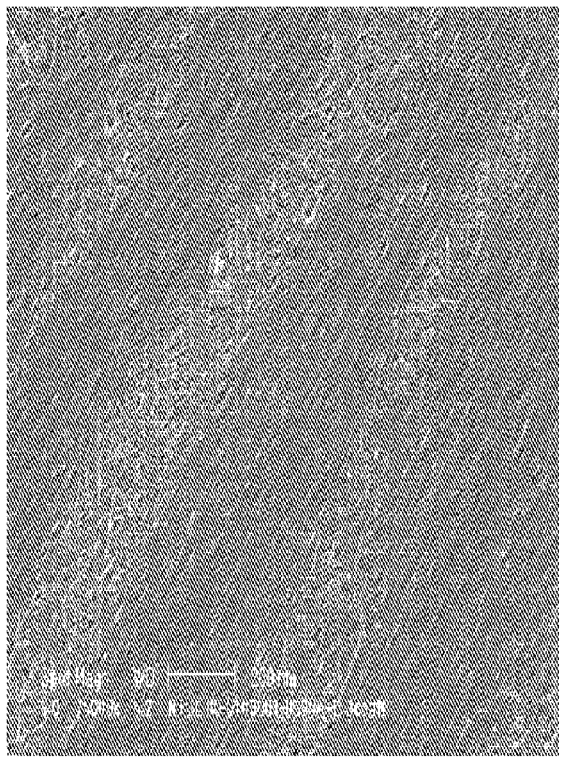
FIG. 10B illustrates an image of a CNT fabric formed by using a CNT solution treated with a BOE solution.

Referring to FIGS. 10A and 10B, there are illustrated images of CNT fabrics formed by using different CNT solutions or dispersions. The CNT fabric shown in FIG. 10A is formed by using a CNT solution without the BOE treatments, while the CNT fabric shown in FIG. 10B is formed by using a CNT solution with the BOE treatments. It is found that the BOE treatment may significantly reduce visual defects in the CNT fabrics. In this example, at most three visual defects can be found on wafers larger than 100 mm.

Although examples and/or embodiments consistent with the present disclosure have been described in detail with respect to the removal of individual types of contaminants and/or impurities, it is to be understood that these embodiments are provided for illustrative and explanatory purposes only. Other embodiments may be apparent to those skilled in the art from consideration of this disclosure and practice of the embodiments described herein. For example, in certain embodiments, two or more types of contaminants and/or impurities may be removed in a single step, in consecutive steps, or in non-consecutive steps. Further, the sequence of the process steps described in this disclosure by no means imply or suggest that these process steps must be performed in accordance with the disclosed order. Other orders of the process steps may be possible and apparent to those skilled in the art. Accordingly, it is intended that the true scope of the present disclosure be defined by the appended claims and their equivalents.

What is claimed is:

1. A method for producing a nanotube solution, comprising:
   dispersing functionalized nanotube: materials in a liquid medium in a first operation, wherein at least a portion of said functionalized nanotube materials have surface carboxylic acid functional groups bound with binary metal counter ions;
   mixing at least one complexing agent with the liquid medium to complex and remove said binary metal counter ions from said functional groups of said functionalized nanotube materials in a second operation; and
   performing a filtration process to the liquid medium so as to remove the complexed binary metal ions in the liquid medium in a third operation;
   wherein said second operation is performed subsequent to said first operation and prior to said third operation.

2. The method of claim 1, further comprising sonicating the liquid medium after mixing the at least one complexing agent with the liquid medium.

3. The method of claim 2, wherein sonicating the liquid medium comprises sonicating the liquid medium in a chilled sonication bath having a temperature of about 5-25° C.

4. The method of claim 1, wherein the filtration process is a cross flow filtration process using a filtration membrane having a pore size of about 0.2 to 2 microns.

5. The method of claim 1, further comprising repeating the cross flow filtration process until concentrations of individual metal impurities are below a predetermined concentration.

6. The method of claim 5, wherein the predetermined concentration is 25 parts per billion (ppb).

7. The method of claim 1, further comprising repeating the mixing step and the performing step until a concentration of individual metal impurities is below a predetermined concentration.

8. The method of claim 7, wherein the predetermined concentration is 25 part per billion.

9. The method of claim 1, further comprising performing a centrifugation process to the liquid medium so as to remove amorphous carbon and larger particles.

10. The method of claim 1, wherein mixing the at least one complexing agent with the liquid medium includes adding a chelating agent in the liquid medium.

11. The method of claim 10, wherein adding the chelating agent comprises adding in the liquid medium one or more of a first amount of ethylenediaminetetraacetic acid (EDTA), a second amount of diethylene triamine pentaacetic acid (DTPA), and a third amount of etidronic acid.

12. A solution, comprising:
   a liquid medium; and
   a plurality of functionalized nanotubes dispersed in the liquid medium, wherein at least a portion of said functionalized nanotubes have surface carboxylic acid functional groups, whereby binary metal counter ions on said functional groups have been complexed with a complexing agent and removed from the functional groups;
   wherein the liquid medium comprises composite molecules of said complexed binary metals complexed with said complexing agent.

13. The solution of claim 12, wherein the liquid medium is one selected from the group consisting of an aqueous solvent, a non-aqueous solvent, and a mixture of the aqueous solvent and the non-aqueous solvent.

14. The solution of claim 12, wherein a first concentration of metal impurities is equal to or less than about 25 parts per billion.

15. The solution of claim 12, wherein the metal ions comprise ionic iron or ionic calcium.

16. The solution of claim 15, wherein a second concentration of residual complexing agent is equal to or less than 25 parts per billion.

17. The solution of claim 12, wherein the solution has a nanotube concentration of about 333 mg/L or more.

18. A method for using a nanotube solution, comprising applying the solution of claim 12 on a substrate so as to form a nanotube fabric layer on the substrate.

19. The method of claim 18, wherein applying the solution comprises spin coating the solution on the substrate.

20. The method of claim 18, wherein applying the solution comprises spraying the solution on the substrate.

* * * * *